(12) United States Patent
Beerens et al.

(10) Patent No.: US 12,242,204 B2
(45) Date of Patent: Mar. 4, 2025

(54) SUBSTRATE SUPPORT, LITHOGRAPHIC APPARATUS, METHOD FOR MANIPULATING CHARGE DISTRIBUTION AND METHOD FOR PREPARING A SUBSTRATE

(71) Applicant: ASML NETHERLANDS B.V., Veldhoven (NL)

(72) Inventors: Ruud Antonius Catharina Maria Beerens, Roggel (NL); Koen Gerhardus Winkels, Schijndel (NL); Dirk Willem Harberts, Eindhoven (NL); Lucas Henricus Johannes Stevens, Eindhoven (NL); Dennis Dominic Van Der Voort, Best (NL); Edwin Johannes Cornelis Bos, Dommelen (NL); George Alois Leonie Leenknegt, Waalre (NL); Nicolaas Ten Kate, Almkerk (NL)

(73) Assignee: ASML NETHERLANDS B.V., Veldhoven (NL)

( * ) Notice: Subject to any disclaimer, the term of this patent is extended or adjusted under 35 U.S.C. 154(b) by 164 days.

(21) Appl. No.: 17/775,361

(22) PCT Filed: Oct. 16, 2020

(86) PCT No.: PCT/EP2020/079297
§ 371 (c)(1),
(2) Date: May 9, 2022

(87) PCT Pub. No.: WO2021/094057
PCT Pub. Date: May 20, 2021

(65) Prior Publication Data
US 2022/0390850 A1 Dec. 8, 2022

(30) Foreign Application Priority Data
Nov. 14, 2019 (EP) .................................. 19209256

(51) Int. Cl.
*G03F 7/20* (2006.01)
*G03F 7/00* (2006.01)
(Continued)

(52) U.S. Cl.
CPC ................ *G03F 7/707* (2013.01); *G03F 7/20* (2013.01); *G03F 7/70941* (2013.01); *H01L 21/67034* (2013.01); *H01L 21/6875* (2013.01)

(58) Field of Classification Search
CPC ............... H01L 21/683; H01L 21/6833; H01L 21/6875; H01L 21/67034; H01L 21/6704;
(Continued)

(56) References Cited

U.S. PATENT DOCUMENTS

| 6,062,240 A | 5/2000 | Sada et al. |
| 2004/0207824 A1 | 10/2004 | Lof et al. |

(Continued)

FOREIGN PATENT DOCUMENTS

| EP | 1420298 | 5/2004 |
| EP | 1498777 | 1/2005 |

(Continued)

OTHER PUBLICATIONS

International Search Report dated Apr. 8, 2021, issued in corresponding International Patent Application No. PCT/EP2020/079297 (5 pgs.).
(Continued)

*Primary Examiner* — Danny Nguyen
(74) *Attorney, Agent, or Firm* — Pillsbury Winthrop Shaw Pittman, LLP

(57) ABSTRACT

A substrate support configured to support a substrate. The substrate support has a plurality of burls protruding from a base surface of the substrate support. The burls have distal ends for supporting a lower surface of the substrate with a gap between the base surface of the substrate support and the (Continued)

lower surface of the substrate. The substrate support has a liquid supply channel configured to supply a conductive liquid to the gap so as to bridge the gap between the base surface of the substrate support and the lower surface of the substrate, to allow charge to pass between the substrate support and the substrate. The substrate support has a controlled electrical potential such that charge distribution at the lower surface of the substrate can be manipulated.

20 Claims, 11 Drawing Sheets

(51) Int. Cl.
    *H01L 21/67*     (2006.01)
    *H01L 21/687*     (2006.01)

(58) Field of Classification Search
    CPC ... H01L 21/67051; G03F 7/07; G03F 7/70941
    USPC .......................................................... 361/234
    See application file for complete search history.

(56) References Cited

U.S. PATENT DOCUMENTS

| | | |
|---|---|---|
| 2006/0115774 A1 | 6/2006 | Wang et al. |
| 2007/0085034 A1 | 4/2007 | Chang et al. |
| 2007/0139632 A1* | 6/2007 | Shiraishi ............. G03F 7/70608 355/55 |
| 2010/0045949 A1 | 2/2010 | Nakano et al. |
| 2011/0089137 A1* | 4/2011 | Tanaka .............. H01L 21/02057 216/13 |
| 2015/0133032 A1* | 5/2015 | Kubo ...................... B24B 49/16 451/73 |
| 2016/0341983 A1 | 11/2016 | Wang et al. |
| 2020/0150549 A1 | 5/2020 | Stevens et al. |

FOREIGN PATENT DOCUMENTS

| | | |
|---|---|---|
| GB | 2383468 | 6/2003 |
| JP | 11-289004 | 10/1999 |
| JP | 2002-353096 | 12/2002 |
| JP | 2006-080543 | 3/2006 |
| JP | 2011-103438 A | 5/2011 |
| JP | 2014-072255 | 4/2014 |
| JP | 2017-016159 | 1/2017 |
| NL | 2024239 | 11/2019 |
| WO | 2006/059634 | 6/2006 |
| WO | 2014/154428 | 10/2014 |
| WO | 2015/193036 | 12/2015 |

OTHER PUBLICATIONS

Written Opinion of the International Searching Authority dated Apr. 8, 2021, issued in corresponding International Patent Application No. PCT/EP2020/079297 (9 pgs.).

\* cited by examiner

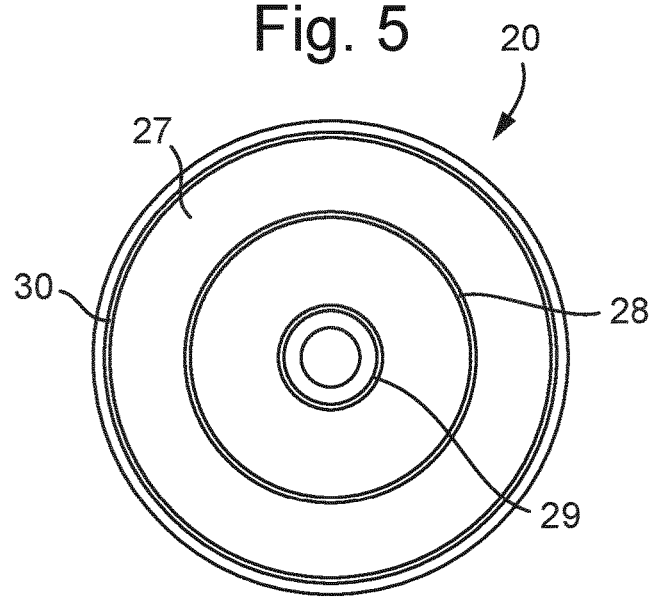
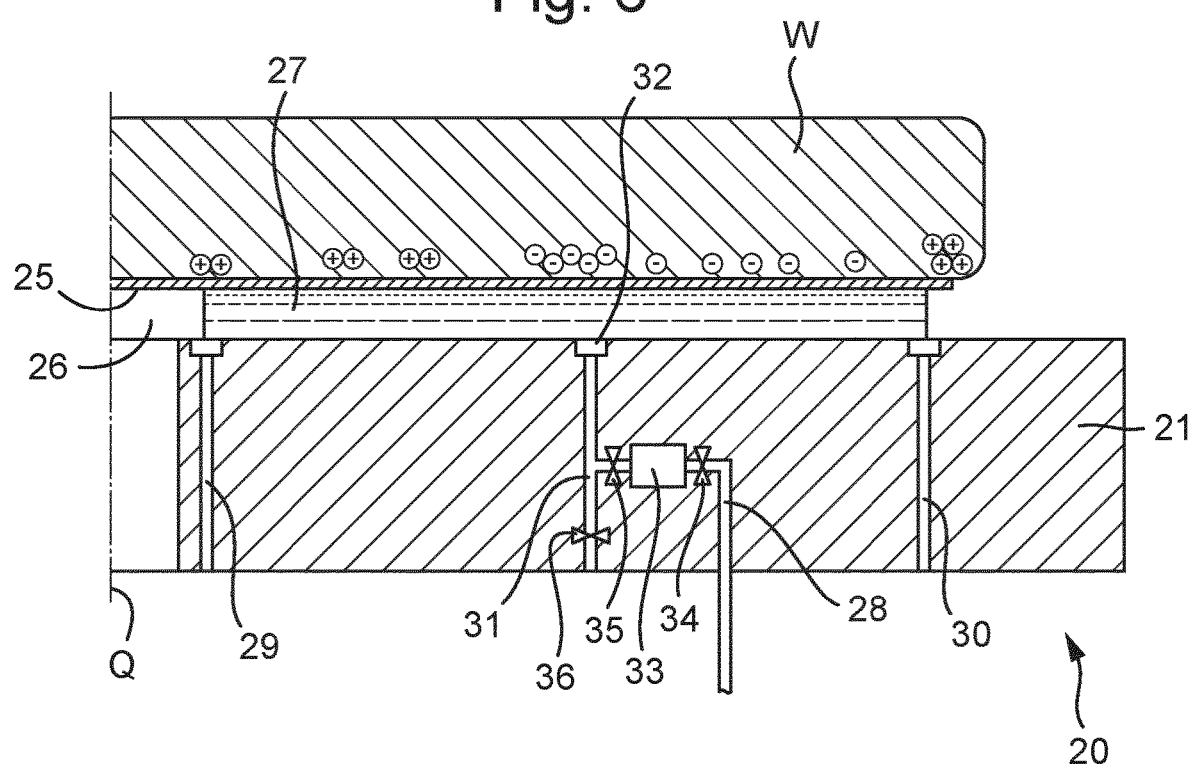

SUBSTRATE SUPPORT, LITHOGRAPHIC APPARATUS, METHOD FOR MANIPULATING CHARGE DISTRIBUTION AND METHOD FOR PREPARING A SUBSTRATE

CROSS-REFERENCE TO RELATED APPLICATIONS

This application is the U.S. national phase entry of PCT Patent Application No. PCT/EP2020/079297 which was filed on Oct. 16, 2020, which claims the benefit of priority of European Patent Application No. 19/209,256.7 which was filed on Nov. 14, 2019 and which is incorporated herein in its entirety by reference.

FIELD

The present invention relates to a substrate support, a lithographic apparatus, a method for manipulating charge distribution and a method for preparing a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs).

The substrate is positioned on a substrate table for the desired pattern to be applied to the substrate. The substrate table can degrade over time, particularly in immersion lithography.

It is desirable to reduce degradation of the substrate table.

SUMMARY

According to an aspect of the invention, there is provided a substrate support configured to support a substrate, the substrate support comprising: a plurality of burls protruding from a base surface of the substrate support, the burls having distal ends in a plane for supporting a lower surface of the substrate with a gap between the base surface of the substrate support and the lower surface of the substrate; and a liquid supply channel for supplying a conductive liquid to the gap so as to bridge the gap between the base surface of the substrate support and the lower surface of the substrate, thereby allowing charge to pass between the substrate support and the substrate; wherein the substrate support has a controlled electrical potential such that charge distribution at the lower surface of the substrate can be manipulated.

According to an aspect of the invention, there is provided a substrate support configured to support a substrate, the substrate support comprising: a plurality of burls protruding from a base surface of the substrate support, the burls having distal ends in a plane for supporting a lower surface of the substrate with a gap between the base surface of the substrate support and the lower surface of the substrate; and a vapour supply channel for supplying a vapour of a conductive liquid to a region of the lower surface of the substrate adjoining the distal end of at least one of the burls, thereby allowing charge to pass between the region of the lower surface of the substrate and the burl; wherein the distal end has a controlled electrical potential such that charge distribution at the lower surface of the substrate can be manipulated.

According to an aspect of the invention, there is provided a method for manipulating charge distribution of a lower surface of a substrate, the method comprising: supporting a lower surface of the substrate on a plurality of burls protruding from a base surface of a substrate support, the burls having distal ends in a plane, with a gap between the base surface of the substrate support and the lower surface of the substrate; and supplying a conductive liquid to the gap so as to bridge the gap between the base surface of the substrate support and the lower surface of the substrate, thereby allowing charge to pass between the substrate support and the substrate; wherein the substrate support has a controlled electrical potential such that charge distribution at the lower surface of the substrate is manipulated.

According to an aspect of the invention, there is provided a method for manipulating charge distribution of a lower surface of a substrate, the method comprising: supporting a lower surface of the substrate on a plurality of burls protruding from a base surface of a substrate support, the burls having distal ends in a plane, with a gap between the base surface of the substrate support and the lower surface of the substrate; and supplying a vapour of a conductive liquid to a region of the lower surface of the substrate adjoining the distal end of at least one of the burls, thereby allowing charge to pass between the region of the lower surface of the substrate and the burl; wherein the distal end has a controlled electrical potential such that charge distribution at the lower surface of the substrate is manipulated.

According to an aspect of the invention, there is provided a method for preparing a substrate for being exposed by a patterned radiation beam, the method comprising: entering the substrate into a lithographic apparatus; supporting the substrate on a substrate support; drying a lower surface of the substrate; and moving the dried substrate to a substrate table where an upper surface of the substrate opposite to the lower surface is to undergo exposure by the patterned radiation beam.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 5 and 6 depict an arrangement of the substrate on the substrate support;

DETAILED DESCRIPTION

Figure 1:
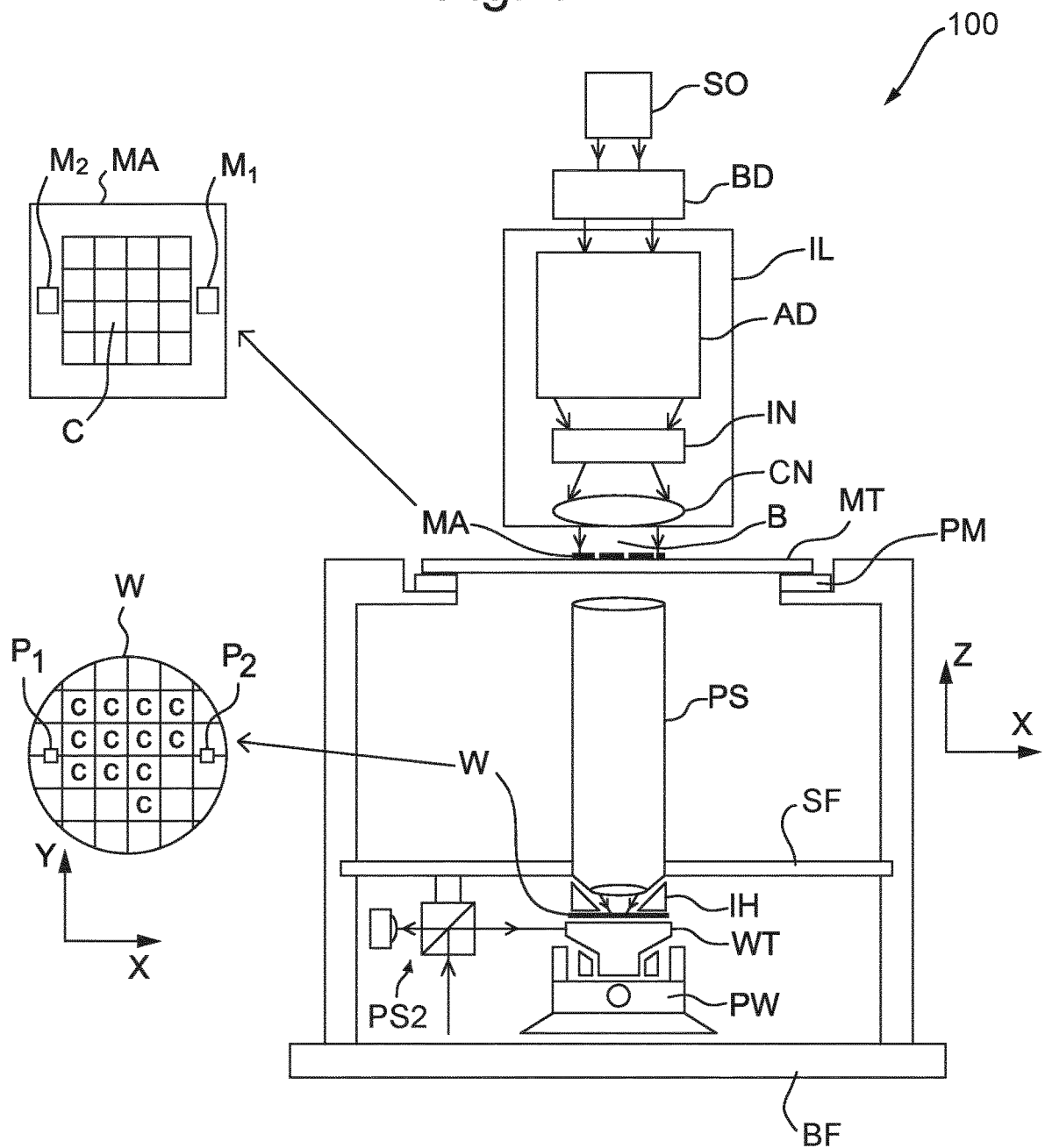
FIG. 1 depicts a lithographic apparatus according to an embodiment of the invention.

FIG. 1 schematically depicts a lithographic apparatus 100 according to an embodiment of the invention. The lithographic apparatus 100 includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device MA in accordance with certain parameters. The lithographic apparatus 100 also includes a substrate table (e.g. a wafer table) WT constructed to hold a substrate (e.g. a resist coated wafer) W and connected to a second positioning device PW configured to accurately position the substrate W in accordance with certain parameters. The lithographic apparatus 100 further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. The mask support structure MT holds the patterning device MA in a manner that depends on the orientation of the patterning device MA, the design of the lithographic apparatus 100, and other conditions, such as for example whether or not the patterning device MA is held in a vacuum environment. The mask support structure MT can use mechanical, vacuum, electrostatic or other clamping techniques to hold the patterning device. The mask support structure MT may be a frame or a table, for example, which may be fixed or movable as required. The mask support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart the radiation beam B with a pattern in its cross-section so as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Assist features may be placed on the patterning device MA to enable isolated and/or semi-isolated design features to be patterned as though they were more dense than they actually are. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The illumination system IL may include an adjuster AD configured to adjust the angular intensity distribution of the radiation beam B. Generally, at least the outer and/or inner radial extent (commonly referred to as σ-outer and σ-inner, respectively) of the intensity distribution in a pupil plane of the illumination system IL can be adjusted. In addition, the illumination system IL may include various other components, such as an integrator IN and a condenser CN. The illumination system IL may be used to condition the radiation beam B, to have a desired uniformity and intensity distribution in its cross section. The illumination system IL may or may not be considered to form part of the lithographic apparatus 100. For example, the illumination system IL may be an integral part of the lithographic apparatus 100 or may be a separate entity from the lithographic apparatus 100. In the latter case, the lithographic apparatus 100 may be configured to allow the illumination system IL to be mounted thereon. Optionally, the illumination system IL is detachable and may be separately provided (for example, by the lithographic apparatus manufacturer or another supplier).

As here depicted, the lithographic apparatus 100 is of a transmissive type (e.g. employing a transmissive mask). Alternatively, the lithographic apparatus 100 may be of a reflective type (e.g. employing a programmable mirror array of a type as referred to above, or employing a reflective mask).

The lithographic apparatus 100 may be of a type having two (dual stage) or more substrate tables WT (and/or two or more mask support structures MT, e.g. mask tables). In such a "multiple stage" lithographic apparatus 100 the additional substrate tables WT and/or mask support structures MT may be used in parallel, or preparatory steps may be carried out on one or more substrate tables WT and/or mask support structures MT while one or more other substrate tables WT and/or mask support structures MT are being used for exposure.

The patterning device MA is held on the mask support structure MT. The radiation beam B is incident on the patterning device MA. The radiation beam B is patterned by the patterning device MA. After being reflected from the patterning device MA, the radiation beam B passes through the projection system PS. The projection system PS focuses the radiation beam B onto a target portion C of the substrate W. The first positioner PM and a first position sensor (e.g., an interferometric device, linear encoder or capacitive sensor) can be used to accurately position the patterning device MA with respect to the path of the radiation beam B. The first position sensor is not explicitly shown in FIG. 1. With the aid of the second positioner PW and a second position sensor PS2 (e.g., an interferometric device, linear encoder or capacitive sensor), the substrate table WT can be moved accurately, e.g., so as to position different target portions C in the path of the radiation beam B.

In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. The patterning device MA may be aligned using mask alignment marks $M_1$, $M_2$. The substrate W may be aligned using substrate alignment marks $P_1$, $P_2$. Although the substrate alignment marks $P_1$, $P_2$ as illustrated occupy dedicated target portions C, they may be located between target portions C (these are known as scribe-lane alignment marks). Similarly, in situations in which more than one die is provided on the patterning device MA, the mask alignment marks $M_1$, $M_2$ may be located between the dies.

Immersion techniques can be used to increase the numerical aperture NA of the projection system PS. As depicted in FIG. 1, in an embodiment the lithographic apparatus 100 is of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus 100, for example, between the patterning device MA and the projection system PS. The term "immersion" as used herein does not mean that a structure, such as the substrate W, must be submerged in liquid, but rather only means that a liquid is located between the projection system PS and the substrate W during exposure.

Referring to FIG. 1, the illuminator IL receives a radiation beam from a source module SO. The source module SO and the lithographic apparatus 100 may be separate entities, for example when the source module SO is an excimer laser. In such cases, the source module SO is not considered to form part of the lithographic apparatus 100 and radiation is passed from the source module SO to the illumination system IL with the aid of a beam delivery system BD. In an embodiment the beam delivery system BD includes, for example, suitable directing mirrors and/or a beam expander. In other cases the source module SO may be an integral part of the lithographic apparatus 100, for example when the source module SO is a mercury lamp. The source module SO and the illumination system IL, together with the beam delivery system BD if required, may be referred to as a radiation system.

Arrangements for providing liquid between a final element of the projection system PS and the substrate W can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

Figure 2:
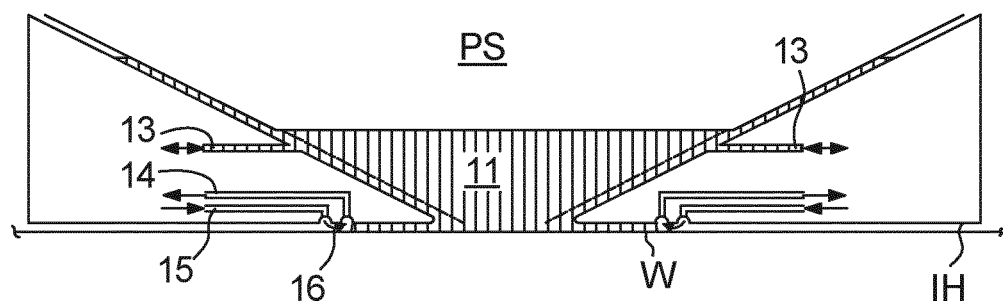
FIG. 2 depicts part of a lithographic apparatus according to an embodiment of the invention.

As depicted in FIG. 1 the liquid supply system is provided with a liquid confinement structure IH which extends along at least a part of a boundary of the space between the final element of the projection system PS and the substrate W, substrate table WT or both. Such an arrangement is illustrated in FIG. 2. The arrangement illustrated in FIG. 2 and described below may be applied to the lithographic apparatus described above and illustrated in FIG. 1.

FIG. 2 schematically depicts a localized liquid supply system or fluid handling system with a liquid confinement structure IH, which extends along at least a part of a boundary of the space 11 between the final element of the projection system PS and the substrate table WT or substrate W. (Please note that reference in the following text to the surface of the substrate W also refers in addition or in the alternative to a surface of the substrate table WT, unless expressly stated otherwise.) In an embodiment, a seal is formed between the liquid confinement structure IH and the surface of the substrate W. The seal may be a contactless seal such as a gas seal 16 (such a system with a gas seal is disclosed in European patent application publication no. EP-A-1,420,298) or a liquid seal.

The liquid confinement structure IH at least partly contains liquid in the space 11 between the final element of the projection system PS and the substrate W. The space 11 is at least partly formed by the liquid confinement structure IH positioned below and surrounding the final element of the projection system PS. Liquid is brought into the space 11 below the projection system PS and within the liquid confinement structure IH by a liquid inlet/outlet 13. The liquid may be removed by a liquid inlet/outlet 13. In an embodiment one of two liquid inlet/outlets 13 supplies the liquid while the other liquid inlet/outlet 13 removes the liquid depending on the scanning direction. At least one of two inlet/outlets 13 may be arranged above or below the bottom surface of the final element of the projection system PS.

The liquid may be contained in the space 11 by the gas seal 16. During use, the gas seal 16 is formed between the bottom of the liquid confinement structure IH and the surface of the substrate W. The gas in the gas seal 16 is provided under pressure via an inlet 15 to the gap between the liquid confinement structure IH and substrate W. The gas is extracted via an outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure IH and the substrate W contains the liquid in the space 11. Such a system is disclosed in United States patent application publication no. US 2004-0207824, which is hereby incorporated by reference in its entirety. In an embodiment, the liquid confinement structure IH does not have a gas seal.

In a localized area liquid supply system, the substrate W is moved under the projection system PS and the liquid supply system. When an edge of the substrate W is to be imaged, an edge of the substrate W (or other object) will pass under the space 11. When a sensor on the substrate table WT (or on a measurement table) is to be imaged, an edge of the substrate W (or other object) will pass under the space 11. A dummy substrate or so-called closing plate can be positioned under the liquid supply system to enable, for example, substrate swap to take place. When the substrate table WT is to be moved such that a dummy substrate or so-called closing plate can be positioned under the liquid supply system, an edge of the substrate W (or other object) will pass under the space 11. Liquid may leak into the gap between the substrate W and substrate table WT. This liquid may be forced in under hydrostatic or hydrodynamic pressure or the force of a gas knife or other gas flow creating device.

Figure 3:
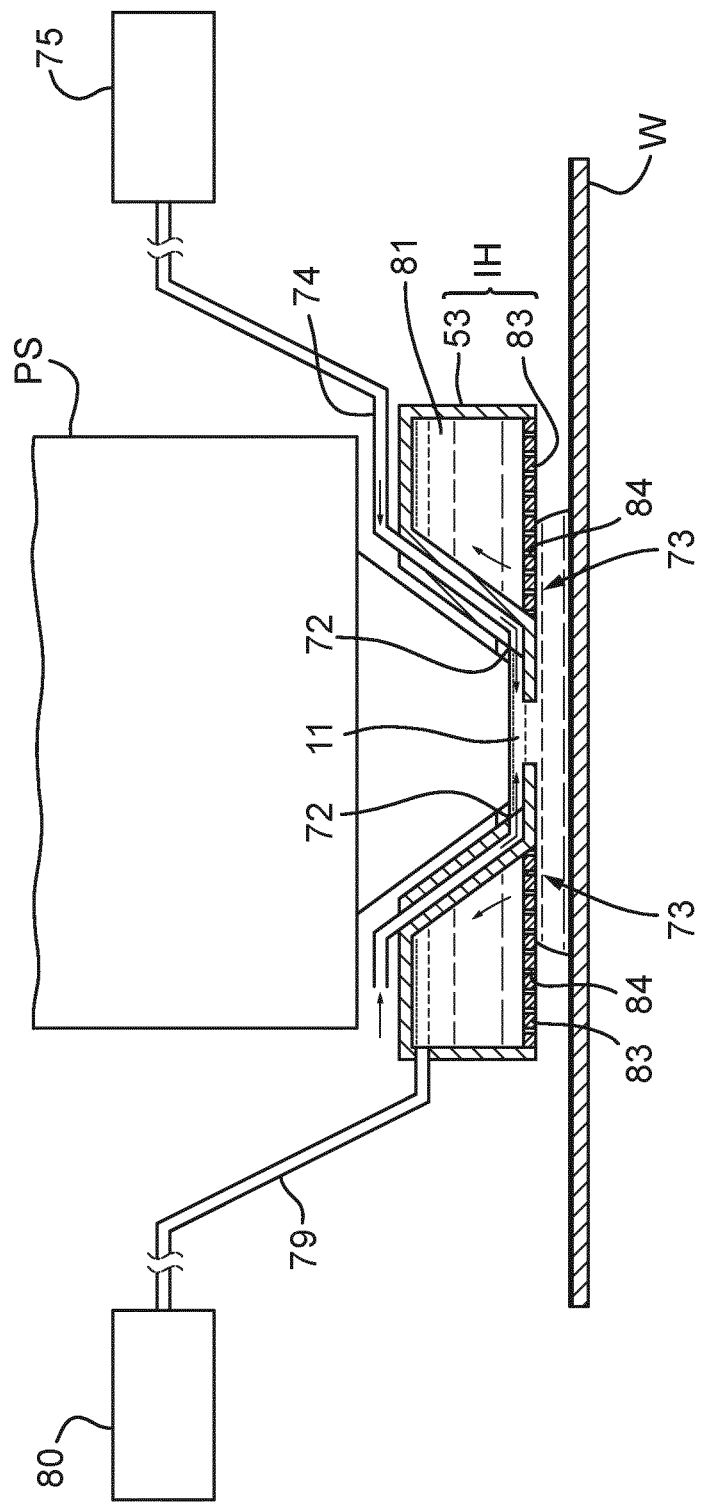
FIG. 3 depicts part of a lithographic apparatus according to an embodiment of the invention.

FIG. 3 is a side cross sectional view that depicts a further liquid supply system or fluid handling system according to an embodiment. The arrangement illustrated in FIG. 3 and described below may be applied to the lithographic apparatus 100 described above and illustrated in FIG. 1. The liquid supply system is provided with a liquid confinement structure IH, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.)

The liquid confinement structure IH at least partly contains liquid in the space 11 between the final element of the projection system PS and the substrate W. The space 11 is at least partly formed by the liquid confinement structure IH positioned below and surrounding the final element of the projection system PS. In an embodiment, the liquid confinement structure IH comprises a main body member 53 and a porous member 83. The porous member 83 is plate shaped and has a plurality of holes (i.e., openings or pores). In an embodiment, the porous member 83 is a mesh plate wherein numerous small holes 84 are formed in a mesh. Such a system is disclosed in United States patent application publication no. US 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid LQ recovered via the recovery port 73 through the passageway 79. The porous member 83 is disposed in the recovery port 73.

In an embodiment, to form the space 11 with the liquid between the projection system PS and the liquid confinement structure IH on one side and the substrate W on the other side, liquid is supplied from the supply ports 72 to the space 11 and the pressure in a recovery chamber 81 in the liquid confinement structure IH is adjusted to a negative pressure so as to recover the liquid via the holes 84 (i.e., the recovery port 73) of the porous member 83. Performing the liquid supply operation using the supply ports 72 and the liquid recovery operation using the porous member 83 forms the space 11 between the projection system PS and the liquid confinement structure IH on one side and the substrate W on the other side.

In use of the lithographic apparatus 100, a substrate W undergoes different lithography steps and process steps. A substrate W may be cleaned, for example by a wet chemical treatment. The substrate W may be heated to a temperature sufficient to drive off any moisture that may be present on the surface of the substrate W. The substrate W may be covered with a layer of resist (e.g. photoresist). The substrate W may be prebaked to drive off excess photoresist solvent. The substrate W is then exposed so that a pattern in the radiation beam B is transferred onto the substrate W. The substrate W may then undergo developing, etching and removal of the resist. These steps may be repeated for a further layer on the substrate W.

As depicted in FIG. 1, in an embodiment the lithographic apparatus 100 comprises a substrate table WT. The substrate table WT is configured to support a substrate W for an exposure process. In an exposure process, the substrate W is exposed to a radiation beam B to form a pattern on the substrate W via a liquid (i.e. immersion liquid).

In an embodiment the lithographic apparatus 100 comprises a storage unit. The storage unit may be part of a substrate handler that controls movement of the substrate W through the lithographic apparatus 100. When a substrate W is entered into a lithographic apparatus 100, the substrate W is positioned first on the storage unit. Subsequently, the substrate W is moved from the storage unit, after which the substrate W is positioned on the substrate table WT for an exposure process. Hence, the substrate W is positioned on the storage unit before it is moved onto the substrate table WT.

Figure 4:
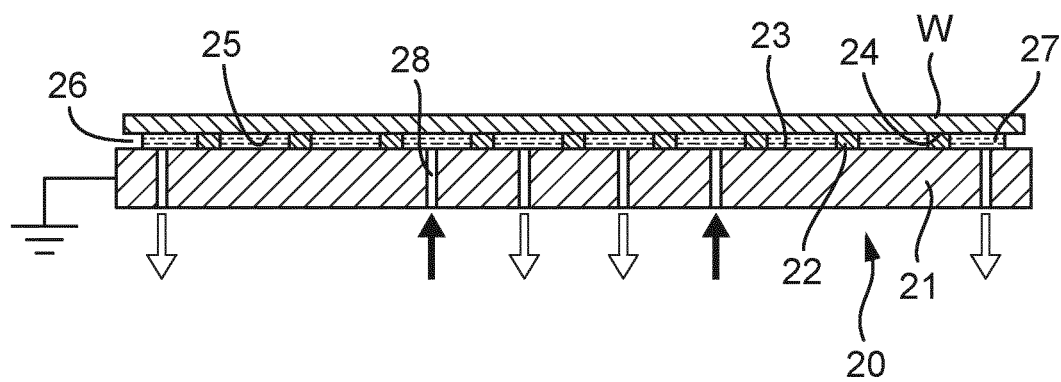
FIG. 4 depicts a substrate on a substrate support according to an embodiment of the invention.

In an embodiment the storage unit comprises a substrate support 20. FIG. 4 depicts a substrate W on the substrate support 20. The substrate support 20 is configured to support the substrate W.

As shown in FIG. 4, the substrate support 20 comprises a main body 21. The main body 21 has a plate-like shape and may be approximately the same shape as the substrate W. For example, when the substrate W is circular, the main body 21 may correspondingly be circular. However, the shape of the main body 21 is not particularly limited. The main body 21 has an upper surface which forms a base surface 23 of the substrate support 20. In an embodiment, the base surface 23 of the substrate support 20 is electrically conductive. In an embodiment the substrate support 20 comprises a coating for the base surface 23. The coating has a reasonably low electrical resistance. In an embodiment the coating is electrically dissipative. For example, in an embodiment the coating has a resistance of at most 100 MΩ. In an embodiment the coating has an electrical resistance of at least 10 kΩ. In an embodiment the coating comprises a diamond-like carbon, a silicon carbide (e.g. silicon infiltrated silicon carbide) and/or chromium nitride.

As shown in FIG. 4, in an embodiment, the substrate support 20 comprises a plurality of burls 22. The burls 22 protrude from the base surface 23 of the substrate support 20. The burls 22 have distal ends 24. The distal ends 24 are at the opposite end of the burls 22 from where the burls 22 connect to the base surface 23 of the substrate support 20. The distal ends 24 of the burls 22 are in a plane for supporting the lower surface 25 of the substrate W.

The lower surface 25 of the substrate W remains flat, regardless of whether the base surface 23 of the substrate support 20 is flat. If the base surface 23 of the substrate support 20 is flat, then all of the burls 22 may have the same height. In an alternative embodiment, the base surface 23 is not flat. For example, the base surface 23 may have a conical shape or a bowl-shape. When the base surface 23 is not flat, then the burls 22 may have different heights depending on their position on the base surface 23.

As shown in FIG. 4, in an embodiment a gap 26 is formed between the base surface 23 of the substrate support 20 and the lower surface 25 of the substrate W. The burls 22 extend across the gap 26 between the base surface 23 of the substrate support 20 and the lower surface 25 of the substrate W. The gap 26 is present between the burls 22.

In an embodiment the substrate W is configured to be clamped onto the burls 22 by an underpressure, e.g. a vacuum. A gap 26 may have a lower pressure compared to the pressure above the substrate W. The difference in pressure above and below the substrate W tends to clamp the substrate W onto the substrate support 20. The size of the gap 26 is not particularly limited. Merely as an example, the gap 26 may be in the range of from about 5 μm to about 200 μm. The size of the gap 26 may correspond to the height of the burls 22.

As shown in FIG. 4, in an embodiment the substrate support 20 comprises a liquid supply channel 28. The liquid supply channel 28 is for supplying a conductive liquid 27 to the gap 26. The conductive liquid 27 bridges the gap 26 between the base surface 23 of the substrate support 20 and the lower surface 25 of the substrate W. This allows electrical charge to pass between the substrate support 20 and the substrate W. Electrical charge can pass between different parts of the lower surface 25 of the substrate W, via the conductive liquid 27. The charge distribution at the lower surface 25 of the substrate W can change as a result of the presence of the conductive liquid 27. The charge distribution can tend to even out across the lower surface 25 of the substrate W. In an embodiment the liquid supply channel 28 is configured to supply a gas that condenses a conductive medium to the lower surface 25 of the substrate W.

In an embodiment the substrate support 20 has a controlled electrical potential such that the charge distribution at the lower surface 25 of the substrate W can be manipulated. For example, as shown in the left hand side of FIG. 4, in an embodiment the substrate support 20 is electrically grounded. As charge passes between the substrate support 20 and the substrate W, the lower surface 25 of the substrate W tends to reach the same potential as the substrate support 20. For example, the lower surface 25 of the substrate W may reach ground potential where the electrical charge can pass through the conductive liquid 27 to/from the substrate support 20.

Electrical charge can be removed from the lower surface 25 of the substrate W via the conductive liquid 27 bridging the gap 26, with the substrate support 20 electrically grounded. However, it is not essential for the substrate support 20 to be electrically grounded. In an alternative embodiment, the substrate support 20 is electrically biased. A redistributed electrical charge can be imposed on the lower surface 25 of the substrate W via the conductive liquid 27 bridging the gap 26, with the substrate support 20 being electrically biased. It is possible to manipulate the charge distribution of the lower surface 25 of the substrate W by controlling the electrical potential of the substrate support 20. In an embodiment the substrate support 20 is controlled to have the same electrical potential as the pedestal or pins that support the substrate W when the substrate W is being loaded onto, or unloaded from, the substrate support 20.

When the substrate W is moved onto the substrate table WT (e.g. for an exposure process), its lower surface 25 has a substantially grounded electrical charge (or otherwise redistributed electrical charge). This reduces the possibility of the substrate table WT being oxidized when the substrate W is placed on the substrate table WT.

In an embodiment, the substrate table WT comprises burls for supporting the lower surface 25 of the substrate W. The top of the burls of the substrate table WT can undergo oxidation when moisture and electrical charge are present. By reducing the electrical charge at the lower surface 25 of the substrate W, the oxidation process is reduced. An embodiment of the invention is expected to reduce degradation of the substrate table WT.

In an embodiment, the substrate support 20 comprises a thermal conditioner configured to thermally condition the substrate W. In an embodiment, the substrate W resides on the substrate support 20 while it is being thermally conditioned. For example, the substrate W may reside on the substrate support 20 for in the region of ten seconds for thermal conditioning. In an embodiment, the process of manipulating the charge distribution via the conductive liquid 27 at the lower surface 25 of the substrate W is performed while the substrate W is being thermally conditioned. The substrate W is thermally conditioned in preparation of an exposure process. For example, the substrate W may be heated, cooled or may have its temperature evened out across its lower surface 25.

FIGS. 5 and 6 depict a substrate W on a substrate support 20 according to an embodiment of the invention. FIG. 5 shows a plan view from above the substrate support 20. The substrate W is not shown in FIG. 5. FIG. 6 shows a side view of a radius of the substrate W and the substrate support 20. In FIG. 6, the axis Q represents the center point of the substrate W and the substrate support 20.

As shown in FIGS. 5 and 6, in an embodiment the substrate support 20 has a hole at its center. The hole may be used for allowing a cylinder to pass through the hole for raising and lowering the substrate W relative to the substrates support 20 (e.g. for loading and unloading of the substrate W). However, it is not essential for such a hole to be provided at the center of the substrate support 20. In an alternative embodiment, the center of the substrate support 20 is filled in, and a plurality of holes are provided at a certain radius of the substrate support 20. The holes may be used for allowing pins to control loading and unloading of the substrate W.

As shown in FIG. 6, in an embodiment the substrate support 20 comprises a chamber 33. The chamber 33 is configured to be filled with a sufficient amount of the conductive liquid 27. The conductive liquid 27 is stored in the chamber 33 and released when the conductive liquid 27 is injected into the gap 26.

As shown in FIGS. 5 and 6, in an embodiment the conductive liquid 27 bridges the gap 26 across most of the lower surface 25 of the substrate W. As shown in FIGS. 5 and 6, in an embodiment, conductive liquid 27 is injected to create a full conductive layer between the substrate W and the substrate support 20. The conductive layer forms a conductive bridge between the substrate W and the substrate support 20. In an embodiment, the conductive liquid 27 bridges the gap 26 across substantially all of the lower surface 25 of the substrate W. Of course, there may be a small portion of the lower surface 25 of the substrate W that is not covered by the conductive liquid 27. For example, at the very outer periphery or that the center of the lower surface 25, there may be no conductive liquid present. The electrical charge can be evened out across substantially all of the lower surface 25 of the substrate W. An embodiment of the invention is expected to reduce degradation across most of, or substantially all of, the substrate table WT.

As mentioned above, in an embodiment, the substrate W is clamped onto the substrate support 20. In an embodiment the conductive liquid 27 is applied in between the substrate W and the substrate support 20 before the substrate W is clamped onto the substrate support 20 (e.g. by applying an underpressure to the gap 26). Additionally or alternatively, in an embodiment, the conductive liquid 27 is applied during clamping of the substrate W onto the substrate support 20.

The conductive liquid 27 can be applied either before loading/clamping of a substrate W and/or can be supplied during the clamping of the substrate W via the liquid supply channel 28.

As shown in FIG. 6, in an embodiment the substrate support 20 comprises a gas supply channel 31. The gas supply channel 31 is configured to supply gas to the gap 26. For example, gas may be supplied to the gap 26 so as to displace the conductive liquid 27 from the gap 26. In an embodiment, the gas supply channel 31 is configured to supply gas to dry the lower surface 25 of the substrate W.

As shown in FIG. 6, in an embodiment the liquid supply channel 28 and the gas supply channel 31 share a common opening 32 in the base surface 23 of the substrate support 20. The channels can be controlled so as to control whether the gas or the conductive liquid 27 is supplied to the gap 26 through the common opening 32. However, it is not essential for a common opening 32 to be provided. In an alternative embodiment, separate supply channels are provided for supplying gas and for supplying conductive liquid 27.

As shown in FIG. 6, in an embodiment the substrate support 20 comprises valves 34 to 36 for controlling the conductive liquid 37 and the gas supplied to the common opening 32. For example, as shown in FIG. 6, in an embodiment the substrate support 20 comprises a first valve 34 at the upstream end of the chamber 33. The first valve 34 is configured to control a flow of conductive liquid 27 into the chamber 33 where the conductive liquid 27 is stored. The first valve 34 may be called a liquid droplet generator. In an embodiment the substrate support 20 comprises a second valve 35. The second valve 35 is positioned at the downstream end of the chamber 33. The second valve 35 controls a flow of conductive liquid 27 from the chamber 33 to the common opening 32. In an embodiment the substrate support 20 comprises a third valve 36. The third valve 36 is configured to control a flow of gas to the common opening 32.

In an alternative embodiment, the liquid supply channel 28 and the gas supply channel 31 do not share a common opening. The liquid supply and the gas supply may come from separate supplies. In such an alternative embodiment the arrangement of valves may be different from the arrangement shown in FIG. 6. Valves may be provided for controlling the supply of liquid and the supply of gas independently.

As mentioned above, in an embodiment the conductive liquid 27 is supplied before clamping of the substrate W onto the substrate support 20. For example, in an embodiment the amount of conductive liquid 27 is supplied to the gap 26 by briefly closing the third valve 36 and opening the first valve 34 and the second valve 35. The liquid supply channel 28 may have an overpressure to form a annular rivulet of the conductive liquid 27 in the region of the common opening 32. The supply of conductive liquid 27 can be stopped by closing the first valve 34 and the second valve 35. Subsequently, the substrate W is clamped onto the substrate support 20 which results in the annular rivulet of conductive liquid 27 being squeezed so that the conductive liquid 27 spreads along the lower surface 25 of the substrate W.

Alternatively, the substrate W may be clamped to the substrate support 20 before the conductive liquid 27 is supplied to the gap 26. For example, as shown in FIGS. 5 and 6, in an embodiment the substrate support 20 comprises an inner extraction channel 29 and an outer extraction channel 30. The inner extraction channel 29 and the outer extraction channel 30 are connected to an underpressure so as to remove matter from the gap 26, for example for clamping. In an embodiment, the extraction channels 29, 30 are used to clamp the substrate W to the substrate support 20 while the second valve 35 and the third valve 36 are closed. Subsequently, the first valve 34 and the second valve 35 are opened briefly so as to supple an amount of the conductive liquid 27 in the gap 26. The conductive liquid 27 spreads in the gap 26 across the lower surface 25 of the substrate W. The second valve 35 and optionally also the first valve 34 are then closed so as to stop the supply of conductive liquid 27. This results in a complete or partial wetted area between the substrate W and the substrate support 20 as shown in FIGS. 5 and 6.

Figure 7:
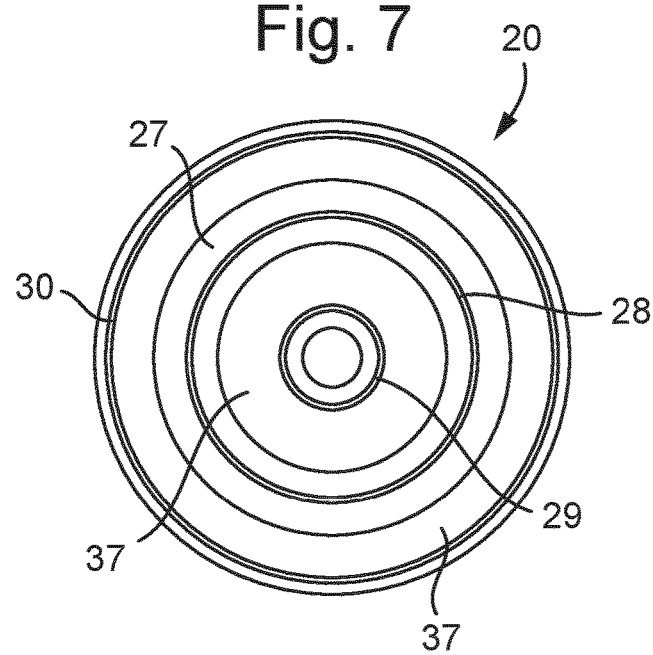
FIGS. 7 and 8 depict another arrangement of the substrate on the substrate support.
Figure 8:
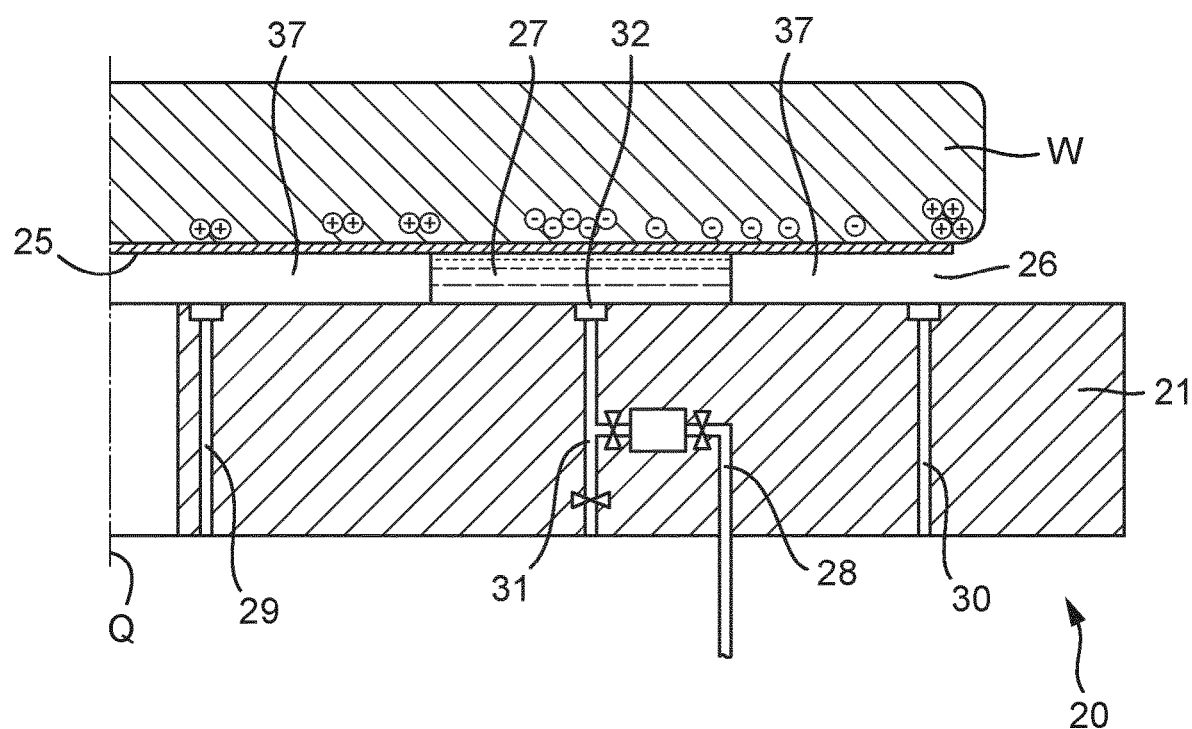

In an arrangement that is alternative to the one shown in FIGS. 5 and 6, the conductive liquid 27 is injected to create a conductive annular liquid layer forming a conductive bridge between the substrate W and the substrate support 20. FIGS. 7 and 8 depict such an arrangement with the substrate W positioned on the substrate support 20.

In either of the arrangements, in the areas where the conductive liquid 27 bridges the gap between the lower surface of the substrate W and the substrate support 20, electrical charge can drain to the substrate support 20. The flow of electrical charge depends on the bias potential and the conductivity of the conductive liquid. In an embodiment, the conductive liquid 27 is sufficiently conductive for the electrical charge to drain substantially completely towards a ground storage unit. In an alternative embodiment, a bias potential is imposed on the substrate support 20 such that a leftover net charge is uniformly distributed across the areas where the conductive liquid 27 bridges the gap 26. The average net charge corresponds to the potential imposed on the substrate support 20. For example, in an embodiment the substrate W is charged to guarantee a net potential above the electrochemical open circuit open potential, such that oxidation does not occur. An embodiment is expected to reduce or eliminate oxidation of the substrate table WT.

As shown in FIGS. 7 and 8, in an embodiment an annular layer of the conductive liquid 27 is positioned radially inward and radially outward of the common opening 32 of the liquid supply channel 28. As shown in FIGS. 7 and 8, the gap 26 remains unbridged across most of the lower surface 25 of the substrate W. The unbridged sections 37 are shown in FIGS. 7 and 8. As shown in FIGS. 7 and 8, in an embodiment an unbridged section 37 is radially inward of the annular layer of the conductive liquid 27. As shown in FIGS. 7 and 8, in an embodiment an unbridged section 37 is radially outward of the annular layer of the conductive liquid 27. However, this is not necessarily the case. In an alternative embodiment, the annular layer of the conductive liquid 27 is at the outer periphery of the lower surface 25 of the substrate W such that there is no significant unbridged section 37 radially outward of the annular layer. In a further alternative embodiment, the annular layer of the conductive liquid 27 is towards the center of the lower surface 25 of the substrate W such that there is no significant unbridged section 37 radially inward of the annular layer of the conductive layer 27.

In an embodiment, conductive liquid 27 is supplied to the gap 26 to form one or more controlled segments where the gap 26 is bridged by the conductive liquid 27. For example, in an embodiment conductive liquid 27 is supplied to form a plurality of concentric rings. The position of the segments may be controlled based on where it is known that electrical charge at the lower surface 25 of the substrate W is undesirable. It may be that other parts of the lower surface 25 of the substrate W are not charged, for example, or the charge is acceptably low. An embodiment of the invention is expected to reduce the time required to sufficiently manipulate the electrical charge at the lower surface 25 of the substrate W.

In an embodiment, the conductive liquid 27 remains substantially stationary while the charge is flowing between the substrate W and substrate support 20. This means that the areas where the conductive liquid 27 bridges the gap 26 do not substantially change during manipulation of the charge distribution at the lower surface 25 of the substrate W. However, this is not necessarily the case. In an alternative embodiment, the conductive liquid 27 moves. For example, in an embodiment the conductive liquid 27 moves radially in the gap 26 along the lower surface 25 of the substrate W. The conductive liquid 27 is sufficiently conductive for the charge to flow between the substrate W and the substrate support 20 while the conductive liquid 27 bridges the gap 26 in each area. For example, in an embodiment gas 38 is supplied to the gap 26 so as to move the conductive liquid 27 in the gap 26 radially. Charge passes between charged locations of the lower surface 25 of the substrate W and the base surface 23 of the substrate support 20 as the conductive liquid 27 moves into contact with the charged locations. For example, the conductive liquid 27 may be removed by injection of the gas 38 subsequent to the injection of the conductive liquid 27. The gas 38 forms an annular bubble pushing the conductive liquid 27 radially. For example, the bubble may push the conductive liquid 27 radially inwards and outwards towards the inner extraction channel 29 and the outer extraction channel 30 of the substrate support 20.

In an alternative embodiment the substrate W and a body of the conductive liquid 27 move rotationally and/or translationally with respect to each other. For example the substrate W may rotate and/or translate with respect to the substrate support 20. A body of the conductive liquid 27 forms an edge of liquid. In an embodiment the body of conductive liquid 27 is continuously refreshed. In an embodiment the body of conductive liquid 27 is bounded by at least one extraction channel 29, 30 and/or at least one gas supply channel 31. In an embodiment the lower surface 25 of the substrate W is coated with a coating (describe below) behind the body of conductive liquid 27. The body of conductive liquid 27 may be formed as a wall of liquid.

In an embodiment the lower surface 25 of the substrate W comprises at least one groove (not shown). In an embodiment the conductive liquid 27 is supplied to the groove and flows along the groove. The conductive liquid 27 may be extracted from another position of the groove. For example, the conductive liquid 27 may be supplied to one end of the groove and extracted from the other end of the groove. In an embodiment a gas such as clean dry air (CDA), extreme clean dry air (XCDA) or nitrogen is supplied to the groove following the conductive liquid 27. The flow path of the gas may be the same as the flow path of the conductive liquid 27. In an embodiment a coating (described below) is applied to the groove following the gas. The flow path of the coating material may be the same as the flow path of the gas. In an embodiment the coating is applied in liquid form.

In an embodiment the groove(s) is/are arranged such that in combination with relative movement between the substrate W and the substrate support 20, the fluids are forced though the groove. In an embodiment the groove has a cross-sectional shape that varies along the length of the groove. This may help to accommodate for a variation in of relative linear speed between the substrate W and the substrate support 20. Such a variation in relative linear speed may result when the substrate W rotates relative to the substrate support 20.

In an embodiment the conductive liquid 27 is applied locally to one or more areas of the lower surface 25 of the substrate W, without directly applying the conductive liquid 27 to the whole of the lower surface 25. In an embodiment the conductive liquid 27 spreads across the lower surface 25 by movement of the substrate W. In an embodiment a gas bearing is applied between the one or more areas where the conductive liquid 27 is applied. The gas bearing is configured to control the height of the lower surface 25 above the substrate support 20. This can help to keep any groove(s) at a controlled height above the substrate support 20.

As mentioned above and shown in FIGS. 5 and 6, in an embodiment, a full conductive layer may be formed between the substrate W and the substrate support 20. Electrical charge can drain towards the substrate support 20 from the moment that an area is wetted between the lower surface 25 of the substrate W and the substrate support 20. Alternatively, when an annular layer of conductive liquid 27 is formed (as shown in FIGS. 7 and 8) the charge drain happens once then annular layer of conductive liquid 27 is pushed through the gap 26.

In an embodiment, a substrate W is prepared for being exposed by a patterned radiation beam. The method comprises entering the substrate W into the lithographic apparatus 100. The substrate W is then supported on a substrate support 20. In an embodiment the substrate support 20 is stationary. The substrate support 20 is not part of the lithographic apparatus 100 that is controlled to move during use.

As explained in further detail below, in an embodiment, the method comprises drying the lower surface 25 of the substrate W before the dried substrate W is then moved to the substrate table WT where the upper surface of the substrate W opposite to the lower surface 25 is to undergo exposure by the patterned radiation beam. By drying the lower surface 25 of the substrate W before the substrate W is positioned onto the substrate table WT, the substrate W has less moisture on its lower surface 25. Less moisture comes into contact with the substrate table WT when the substrate W is loaded onto the substrate table WT. An embodiment of the invention is expected to reduce degradation of the substrate table WT. In particular, an embodiment of the invention is expected to reduce oxidation of the substrate table WT.

In an embodiment, the lower surface 25 of the substrate W is dried by application of a deep vacuum in the gap 26 between the substrate W and the substrate support 20. Optionally, the gap 26 may be purged with a humidity free gas for better removal of humidity. For example, the humidity free gas may be supplied from the gas supply channel 31. In an embodiment, the deep vacuum is applied by extracting gas through the inner extraction channel 29 and/or the outer extraction channel 30. The deep vacuum is a lower pressure than the pressure required to clamp the substrate W to the substrate support 20. When the substrate W is clamped onto the substrate support 20, an underpressure is provided in the gap 26. However, the underpressure is not a sufficiently low pressure to remove water from the lower surface 25 of the substrate W. In contrast, when the deep vacuum is applied, moisture is removed from the lower surface 25. The drying is achieved by applying an underpressure to the gap 26 between the lower surface 25 of the substrate W and the base surface 23 of the substrate support 20 so as to remove liquid droplets from the lower surface 25 of the substrate W. The drying may be pressure induced. In an embodiment, an underpressure is applied to the gap 26 so as to remove all liquid (e.g. water) from the lower surface 25 of the substrate W. For example, a liquid film may be removed from the lower surface 25 of the substrate W.

In an embodiment, the process of manipulating charge distribution is performed without also drying the substrate W. In an alternative embodiment, the drying process is performed without also manipulating the charge distribution. In a further alternative embodiment, both the charged distribution manipulation and the drying process are performed. In such an embodiment, the manipulation of the charged disruption is performed first using the conductive liquid 27. The conductive liquid 27 is then removed. For example, a gas 38 may be provided through the gas supply channel 31 to remove the conductive liquid 27 from the gap 26. In an embodiment, the gas 38 supplied to the gap 26 is clean dry air (CDA), extreme clean dry air (XCDA), nitrogen or a humidity free gas. In an embodiment the conductive liquid 27 comprises IPA. IPA evaporates more quickly than water. An embodiment of the invention is expected to reduce effects of evaporation on the substrate W.

In the Figures, the gas supply channel 31 is shown at an intermediate radius. However, this is not necessarily the case. In an alternative embodiment the gas supply channel 31 may be near the center of the substrate support 20 or at an outer periphery of the substrate support 20.

Figure 9:
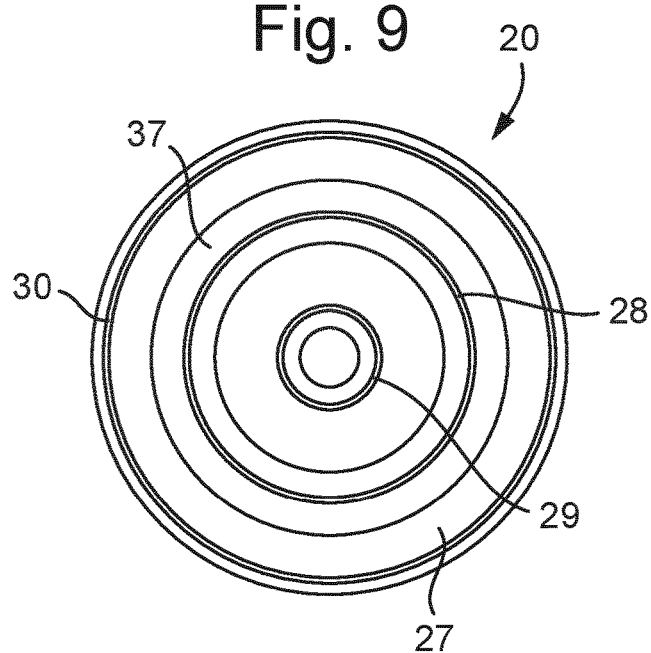
FIGS. 9 and 10 depict conductive liquid being removed from the arrangement shown in FIGS. 5 and 6.
Figure 10:
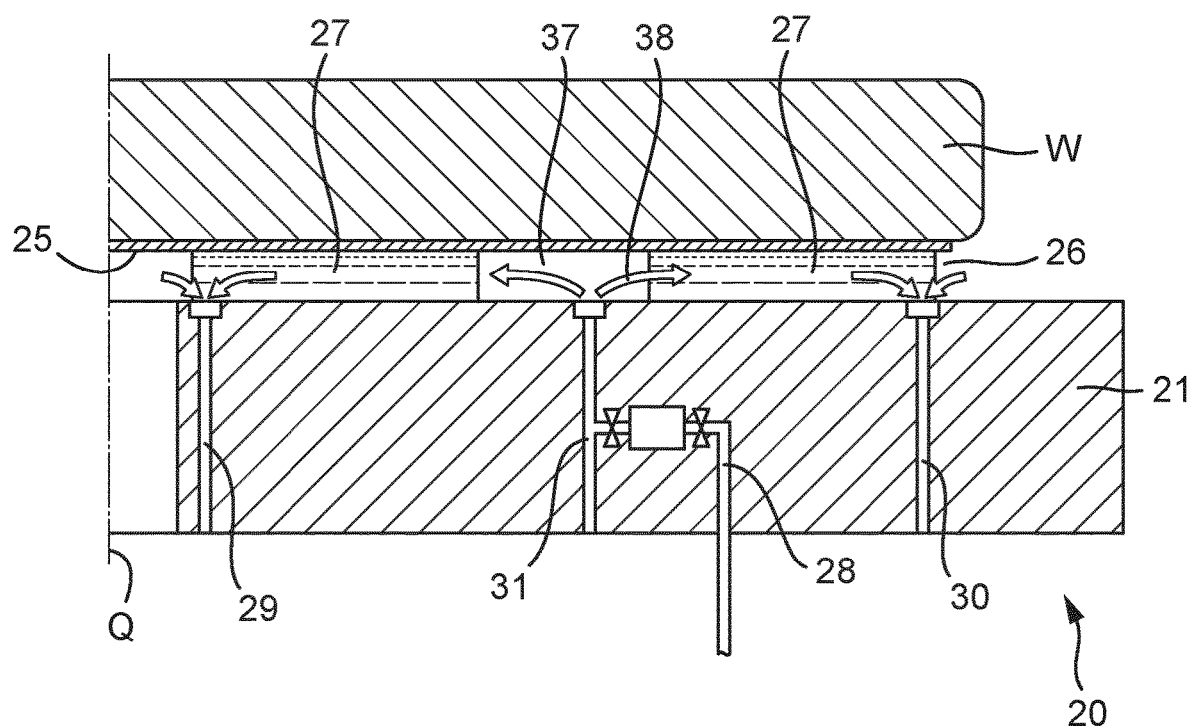

In an embodiment, the conductive liquid 27 is pushed towards the inner extraction channel 29 and/or the outer extraction channel 30. FIGS. 9 and 10 depict a gas 38 pushing the conductive liquid 27 towards the extraction channels 29, 30. The liquid 27 is removed through the extraction channels 29, 30 away from the gap 26.

Figure 13:
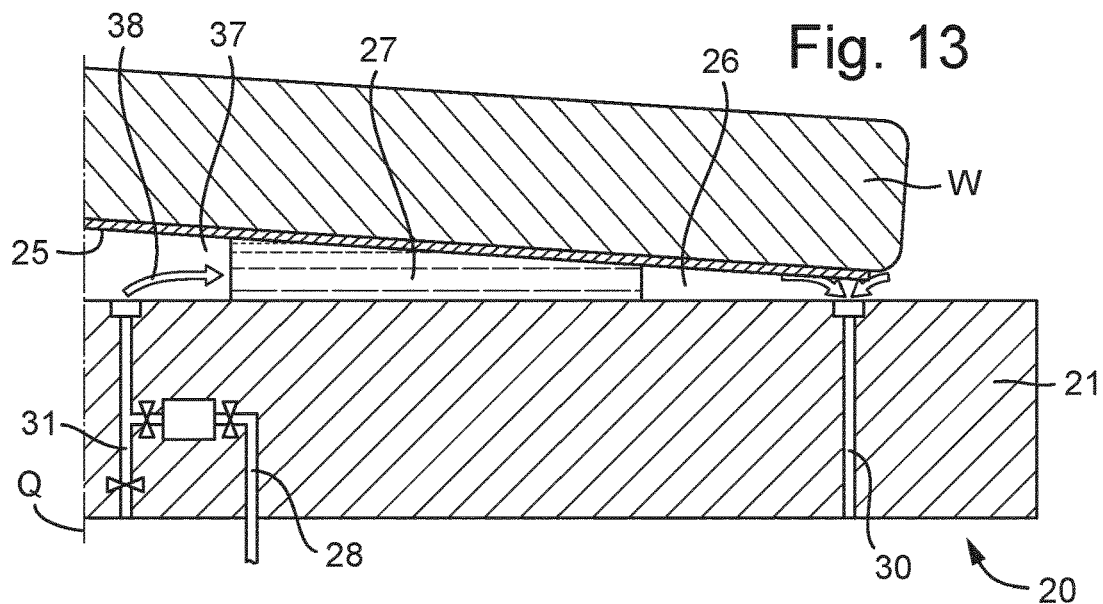
FIG. 13 depicts a substrate on a substrate support according to an embodiment of the invention.
Figure 14:
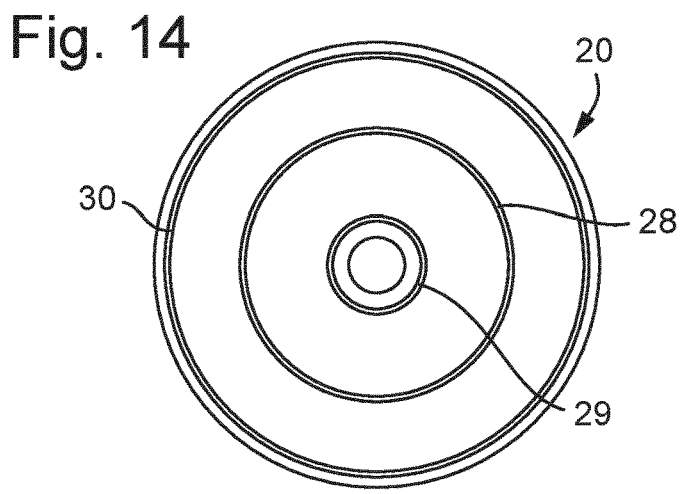
FIGS. 14 and 15 depict drying of the lower surface of the substrate on a substrate support according to an embodiment of the invention.
Figure 15:
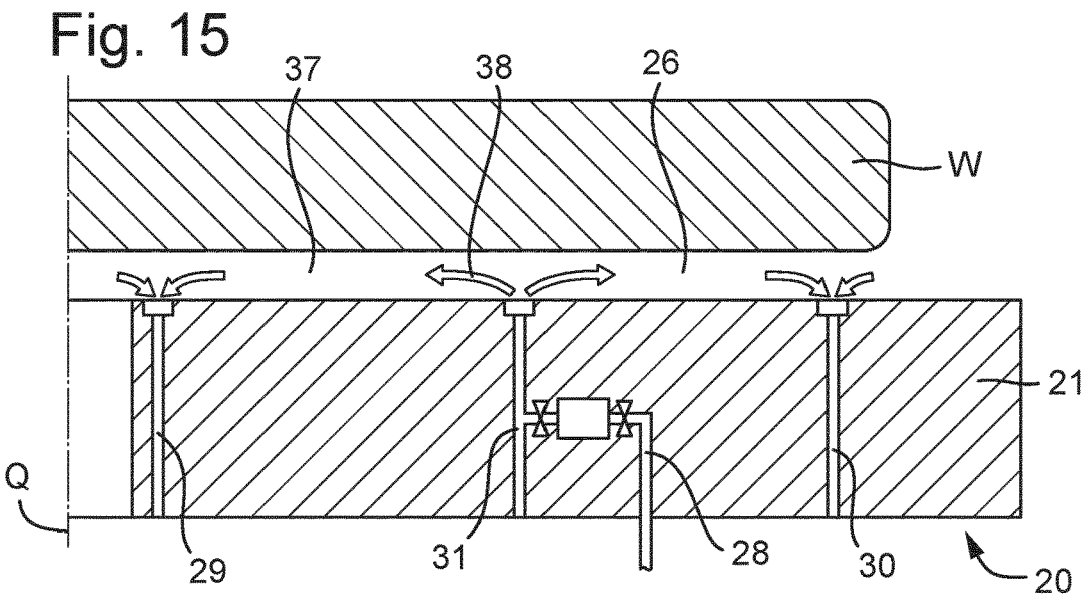

FIG. 13 depicts a further possible feature of the arrangement between the substrate W and the substrate support 20. As shown in FIG. 13, in an embodiment the base surface 23 of the substrate support 20 is shaped such that the gap 26 narrows towards the extraction channel 30. This enables capillary effects to facilitate or simplify the motion of the conductive liquid 27 towards an extraction channel, e.g. the outer extraction channel 30. In an embodiment, the base surface 23 is hydrophilic. In an embodiment, the lower surface 25 of the substrate W is hydrophilic. As shown in FIG. 13, in an embodiment a geometry configuration such as a wedge is formed for the gap 26.

Figure 11:
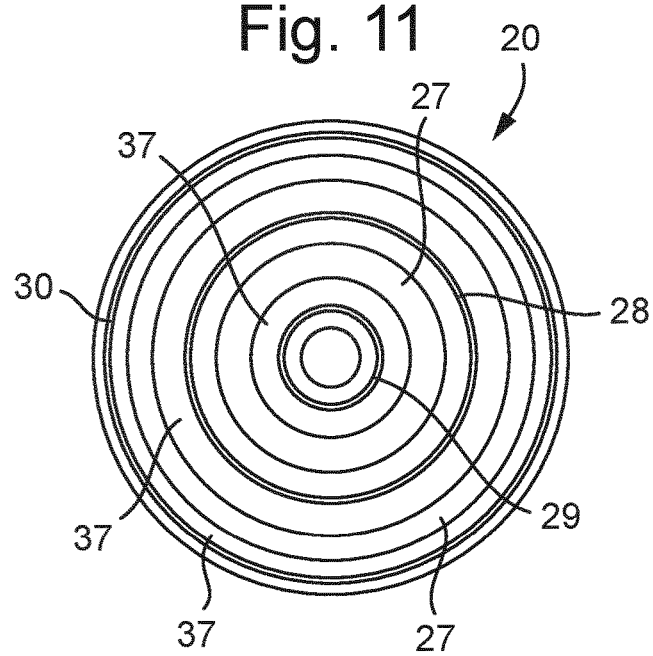
FIGS. 11 and 12 depict conductive liquid being removed from the arrangement shown in FIGS. 7 and 8.
Figure 12:
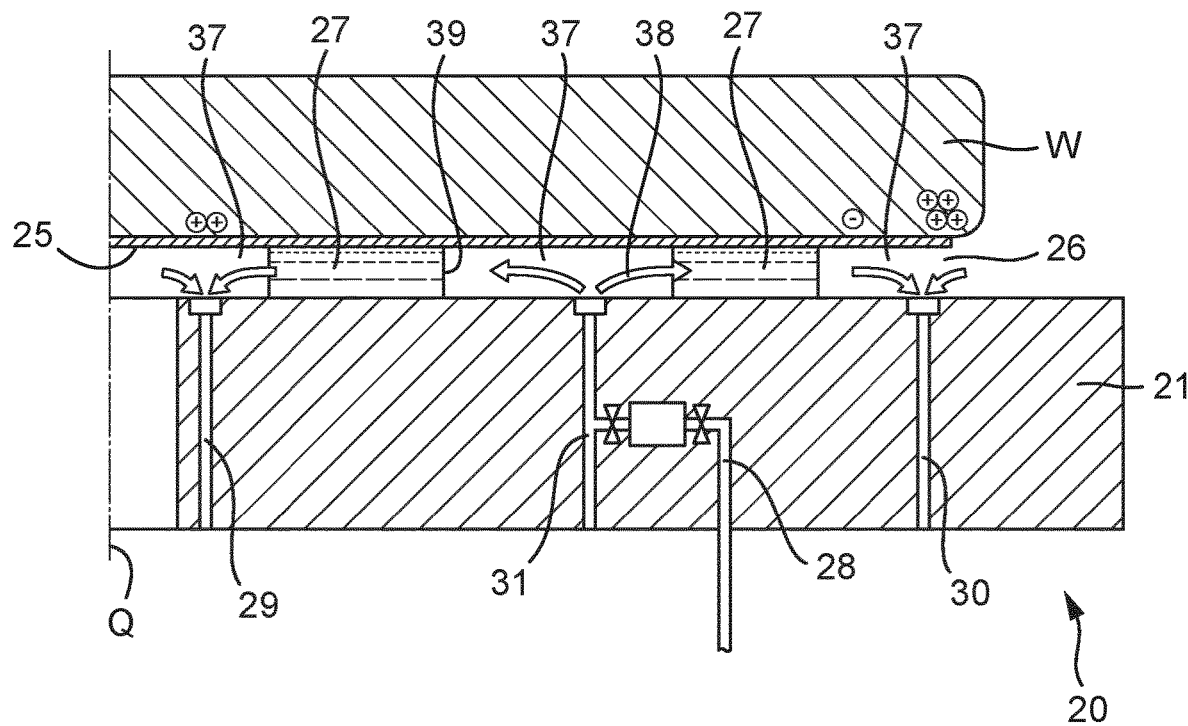

FIGS. 11 and 12 depict gas 38 being supplied to push the conductive liquid 27 out from the gap 26. FIGS. 11 and 12 show the conductive liquid 27 being pushed through the gap 26 when the conductive liquid 27 forms an annular layer, as shown in FIGS. 7 and 8. In contrast FIGS. 9 and 10 correspond to the arrangement in which a full layer of conductive liquid 27 is formed, as shown in FIGS. 5 and 6.

In an embodiment, drying of the lower surface 25 of the substrate W may be flow induced. In an embodiment, the drying is by supplying a gas flow from the substrate support 20 to the gap 26 between the lower surface 25 of the substrate W and the base surface 23 of the substrate support 20. For example, a strong flow of humidity free gas may dry the substrate W. The gas may be supplied through the gas supply channel 31.

In an embodiment, the gas flow provides a gas film for supporting the substrate W above the substrate support 20 without contact between the substrate W and the substrate support 20. Above a certain flow rate, a gas bearing is formed in which the substrate W detaches from the burls 22 of the substrate support 20. The substrate W levitates on the gas film above the burls 22. In an embodiment, gas 38 is continued to be extracted through the extraction channels 29, 30 so as to maintain a sufficient underpressure to hold the substrate W onto the burls 22 or to hold the substrate W at a limited flying height above the burls 22. In an embodiment, gas 38 is extracted through the extraction channels 29, 30 so as to extract all of the flow supplied. By providing the gas film for supporting the substrate W without contact with the substrate support 20, any influence of the burls 22 on the charge distribution or drying of the substrate W can be reduced. In an embodiment, the substrate support W is designed as a gas bearing in which a pure large radial flow of gas dries the lower surface 25 of the substrate W.

As mentioned above, in an embodiment the substrate support 20 comprises burls 22. However, this is not necessarily the case. In an alternative embodiment, the substrate support 20 does not have burls 22. The substrate support 20 may have the form of a flat plate with only supply and extraction channels. The substrate support 20 is configured to not contact the substrate W during use. In an embodiment, the substrate support 20 is configured to thermally condition the substrate W and to dry the lower surface of the substrate W. The substrate support 20 may not be configured to manipulate the charge distribution by using a conductive liquid 27. This reduces the risk of capillary clamping which might otherwise make it more difficult to remove the liquid in a short time span.

As mentioned above, in an embodiment, the conductive liquid 27 is removed by the injection of a gas 38 subsequent to the injection of the conductive liquid 27. The gas 38 pushes the conductive liquid 27 through the gap 26. In an embodiment, the gas 38 comprises a vapor of organic liquid soluble in the conductive liquid 27 such that the vapor dissolves into a meniscus 39 (shown in FIG. 12, for example) of the conductive liquid 27 while the meniscus 39 moves across the lower surface 25 of the substrate W. This promotes drying of the lower surface 25 of the substrate W. For example, in an embodiment, isopropyl alcohol (IPA) vapor is added to the gas 38. This creates a Marangoni drying pocket adjacent to the meniscus 39. The Marangoni drying promotes better drying of the lower surface 25 of the substrate W. The IPA (or other alcohol solvent) lowers the surface tension of the meniscus 39. In an embodiment, the solvent used is easily vaporized.

Figure 16:
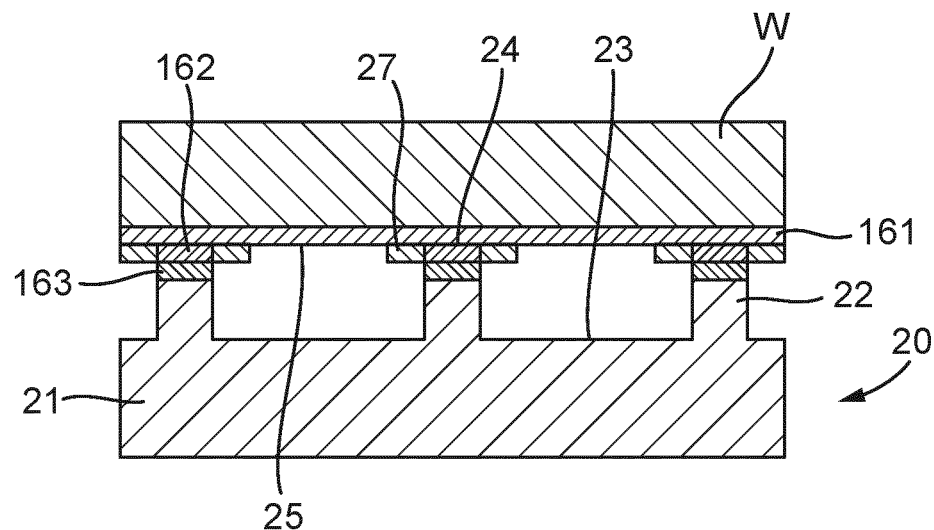
FIG. 16 depicts a substrate on a substrate support according to an embodiment of the invention.
Figure 19:
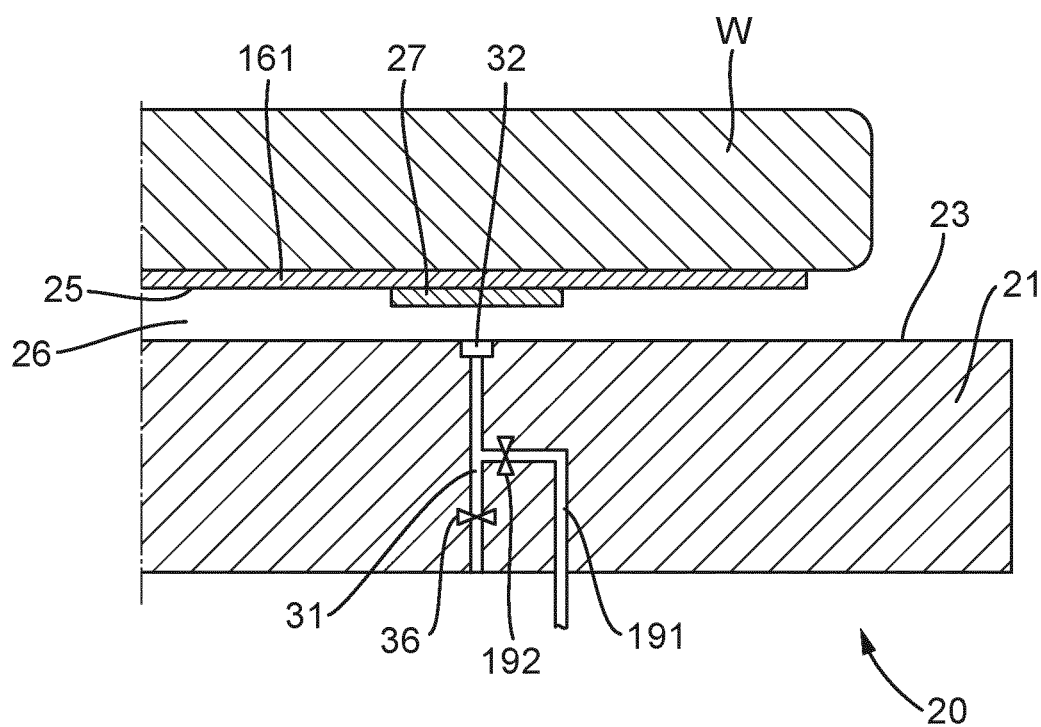
FIG. 19 depicts an alternative view of a substrate support according to an embodiment of the invention.

FIG. 16 schematically depicts a substrate W on a substrate support 20 according to an alternative embodiment of the invention. FIG. 19 schematically depicts an alternative view of the substrate W on the substrate support 20. FIG. 19 is a cross section that does not go through any of the burls 22. Many features of the substrate support 20 are the same as in the substrate support 20 described above. The description below focuses in different features of the substrate support 20 shown in FIGS. 16 and 19.

As shown in FIG. 19, in an embodiment the substrate support 20 comprises a vapor supply channel 191. The vapor supply channel 191 is for supplying a vapor of the conductive liquid 27 to a region of the lower surface 25 of the substrate W. In an embodiment, the vapor supply channel 191 is configured to supply humid air comprising the vapor of the electrically conductive liquid 27. When the vapor is supplied to the gap 26, a moisture layer of the conductive liquid 27 is formed at the lower surface 25 of the substrate W, as shown in FIGS. 16 and 19. The conductive liquid 27 covers a region of the lower surface 25 of the substrate W.

The region of the lower surface 25 of the substrate W to which the moisture layer of the conductive liquid 27 is applied adjoins the distal end 24 of at least one of the burls 22. This allows charge to pass between the region of the lower surface 25 of the substrate W (to which the moisture layer is applied) and the burl 22.

Figure 20:
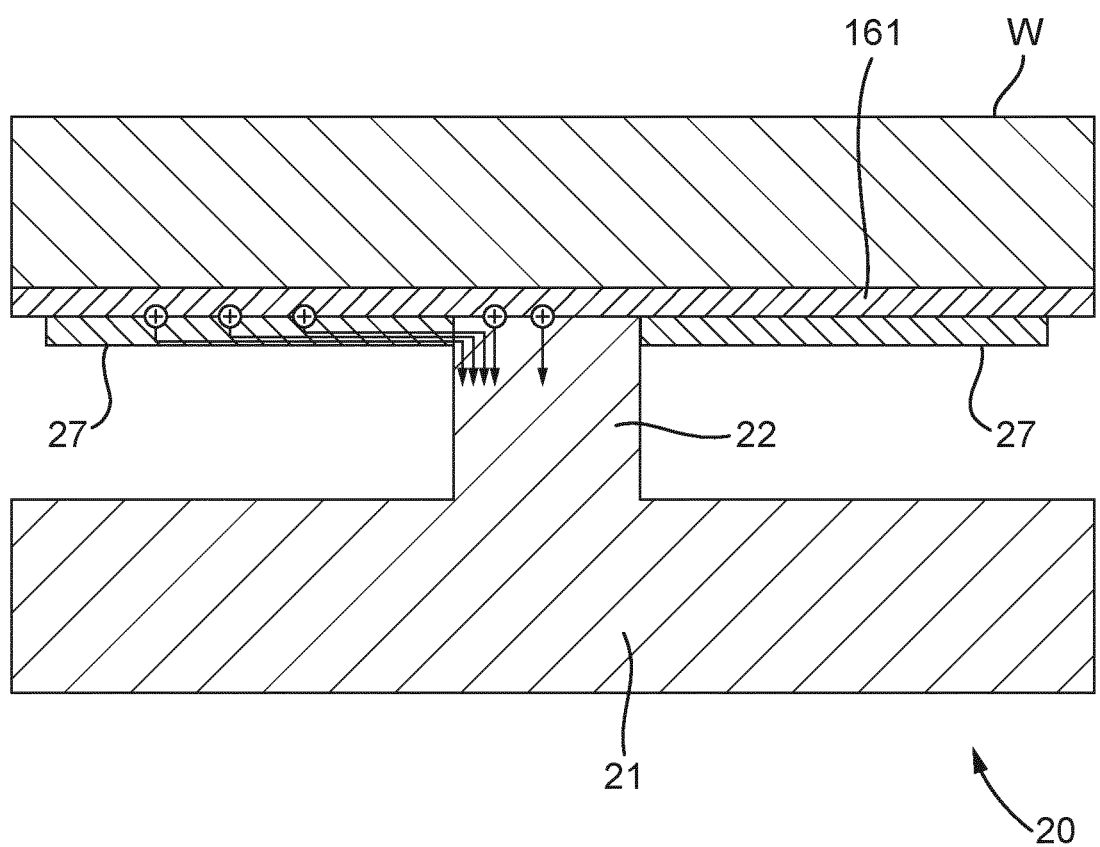
FIG. 20 depicts an alternative view of a substrate support according to an embodiment of the invention.

FIG. 20 schematically depicts the passage of electrical charges between the lower surface 25 of the substrate W and one of the burls 22. FIG. 20 shows a plurality of positive charges at the lower surface 25 of the substrate W. In particular, FIG. 20 shows positive charges at the portion of the lower surface 25 of the substrate W that is physically in contact with the distal end 24 of the burl 22. FIG. 20 further shows positive charges in another portion of the lower surface 25 that does not come into direct contact with the distal end 24 of the burl 22. In an embodiment, at least part of the substrate support 20 is electrically grounded or electrically biased. For example, as described above the base surface 23 of the substrate 20 is electrically grounded or electrically biased. Additionally or alternatively, the distal end 24 of the burl 22 is electrically grounded or electrically biased.

The charges that are at the portion of the lower surface 25 of the substrate W in physical contact with the burl 22 may pass between the lower surface 25 and the burl 22. By providing the moisture layer of the conductive liquid 27 in the region of the lower surface 25 adjoining the distal end 24 of the burl 22, the other positive charges pass between the lower surface 25 and the burl 22. In an embodiment, the distal end 24 has a controlled electrical potential such that charge distribution at the lower surface 25 of the substrate W can be manipulated.

In an embodiment, the substrate support 20 is used to support the substrate W before the substrate W is moved onto the substrate table WT used during an exposure process. By supplying the vapor of a conductive liquid 27 to a region of the lower surface 25 adjoining the distal end 24 of at least one of the burls 22, charges can be removed from the substrate W before the substrate W is placed onto the substrate table WT. In an embodiment the burls 22 are electrically conductive. The distal ends 24 of the burls 22 of the substrate support 20 may undergo oxidation. This can help reduce the amount of oxidation that occurs when the substrate W is on the substrate table WT used for exposure processes.

In an embodiment, the substrate table WT comprises a plurality of burls having distal ends in a plane for supporting the lower surface 25 of the substrate W during an exposure process. In an embodiment, the pattern of burls 22 of the substrate support 20 is the same as the pattern of burls on the substrate table WT. In an embodiment, the positions of center of the burls 22 of the substrate support 20 in plan view are the same as the positions of the centers of the burls of the substrate table WT. As shown in FIG. 20, charges can be removed from portions of the lower surface 25 of the substrate W that come into contact with the distal ends 24 of the burls 22. By providing that the pattern of burls is the same between the substrate support 20 and the substrate table WT, the electrical charge is removed from the substrate W, particularly from the portions where it was most likely to cause problems of oxidation of the substrate table WT. An embodiment of the invention is expected to reduce degradation of the substrate table WT.

It is not essential for the pattern of burls 22 of the substrate support 20 to be the same as the pattern of burls of the substrate table WT. Charge can be removed from sections of the lower surface 25 that will be in contact with the burls of the substrate table WT via the moisture layer of the conductive liquid 27.

As shown in FIGS. 16, 19 and 20, in an embodiment a moisture layer is provided around the burls 22 of the substrate support 20. The moisture layer of the conductive liquid 27 allows charge to be removed from sections of the lower surface 25 that are not directly in contact with the distal ends 24 of the burls 22.

It is not essential for the moisture layer to be provided to the lower surface 25 of the lower substrate W. Electrical charge can be removed from portions of the lower surface 25 that are in direct contact with the burls 22 of the substrate support 20 without the need for the moisture layer of the conductive liquid 27. The conductive liquid 27 allows charge to be removed from a larger area of the substrate W.

The conductive liquid 27 is configured to mobilize otherwise immobilized electrical charge at the lower surface 25. As shown in FIG. 16, in an embodiment the substrate support 20 comprises a coating 162 at the distal ends 24 of the burls 22. The coating 162 has a reasonably low electrical resistance. In an embodiment the coating is electrically dissipative. For example, in an embodiment the coating 162 has a resistance of at most 100 MΩ, optionally at most 10 MΩ, and optionally at most 1 MΩ. In an embodiment the electrical resistance of at least 10 kΩ. In an embodiment the coating 162 comprises a diamond-like carbon (DLC), a silicon carbide (e.g. silicon infiltrated silicon carbide, SiSiC) and/or chromium nitride.

Figure 17:
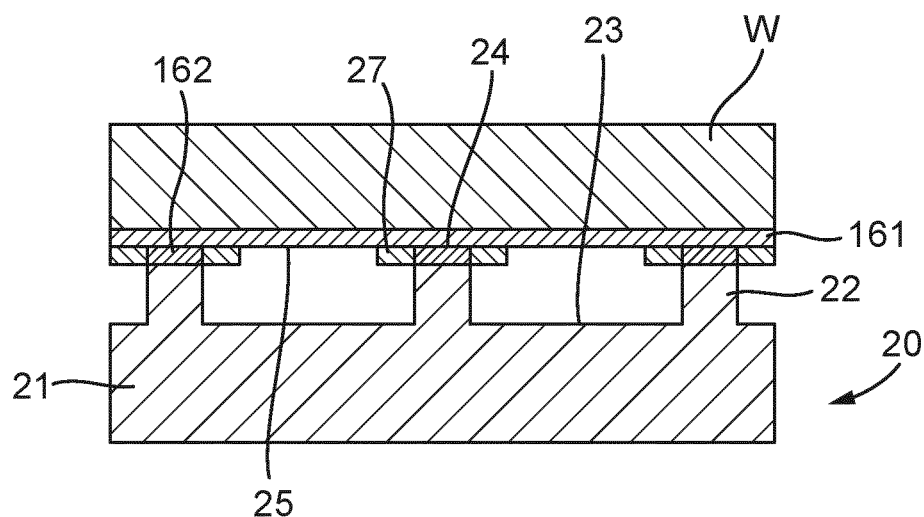
FIG. 17 depicts a substrate on a substrate support according to an alternative embodiment of the invention.

As shown in FIG. 16, in an embodiment the burl 22 comprises a further coating layer 163. The further coating layer 163 is positioned between the coating 162 and the bulk of the burl 22. The further coating layer 163 may comprise a material that is susceptible to oxidation, for example carbon. The further coating layer 163 may comprise a catalyst configured to chemically reduce the vapour at the lower surface 25. This can help to create positive ions so as to at least partially neutralise the charges on the substrate W. FIG. 17 depicts an alternative embodiment of the substrate support 20. As shown in FIG. 17, in an embodiment the further coating layer 163 is not provided.

Figure 18:
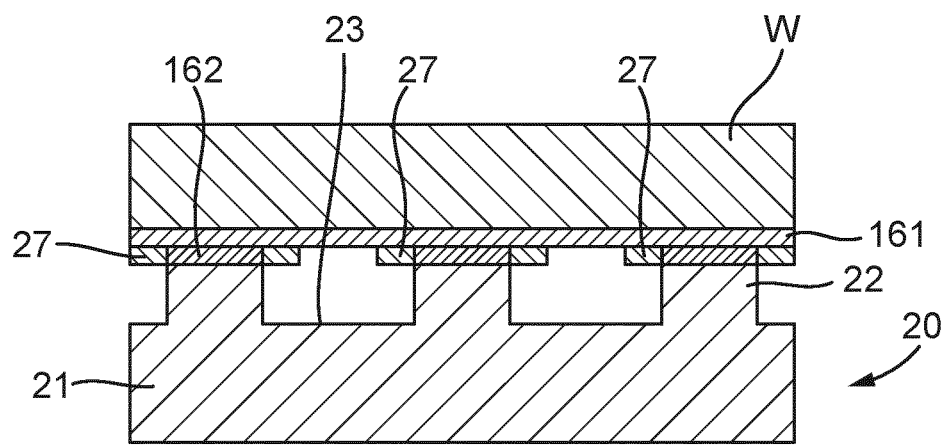
FIG. 18 depicts a substrate on a substrate support according to an alternative embodiment of the invention.

FIG. 18 shows an alternative embodiment of the substrate support 20. In the embodiment shown in FIG. 18, the burls 22 of the substrate support 20 have a larger diameter compared to the burls 22 shown in the substrate support of FIG. 16 or FIG. 17, for example. In an embodiment, the burls 22 of the substrate support 20 have a greater diameter than the burls of the substrate table WT. By providing that the burls 22 have a greater diameter, the possibility of electrical charge remaining in a region of the lower surface 25 that will come into contact with the burls of the substrate table WT can been reduced. There may be some positional deviation or misalignment when the substrate W is positioned to the substrate table WT. The larger diameter burls 22 shown in FIG. 18 remove electrical charge from larger local areas of the lower surface 25 of the substrate W. This allows for some inaccuracy when the substrate W is positioned onto the substrate table WT. The burls of the substrate table WT fit within the regions of the lower surface 25 that have had their charge removed by the burls 22 of the substrate support 20.

Optionally, the moisture layer of the conductive layer 27 may be provided around the burls 22 so as to allow charge to be removed from a larger region of the lower surface 25 of the substrate W. The electrical charge is removed from the lower surface 25 via the electrically conductive distal ends 24 of the burls 22.

As shown in FIG. 16, for example, in an embodiment the lower surface 25 of the substrate W comprises an insulating layer 161. In an embodiment the insulating layer 161 comprises $SiO_2$. Other possible materials for the insulating layer are known to the skilled person in the art.

As shown in FIG. 19, in an embodiment the substrate support 20 comprises a gas supply channel 31. In an embodiment the gas supply channel 31 and the vapor supply channel 191 share a common opening 32 at the base surface 23 of the substrate support 20. In an embodiment a vapor valve 192 is provide to control supply of the vapor of the conductive liquid 27 through the opening 32.

In an alternative embodiment, the vapor supply channel 191 and the gas supply channel 31 may be a single channel. The gas supply channel 31 may function as a vapor supply channel 191 by supplying vapor of the conductive liquid 27 to the gap 26.

In an embodiment the gas supply channel 31 is configured to supply gas to the gap 26 so as to remove the moisture layer of the conductive liquid 27 from the lower surface 25 of the substrate W.

In an embodiment, the charge manipulation and drying of the substrate W occur while the substrate W is being thermally conditioned on the substrate support 20. An embodiment of the invention is expected to reduce degradation of the substrate table WT without significantly decreasing throughput. In an alternative embodiment the thermal conditioning is performed after the charge removal and/or the drying.

In an embodiment, the conductive liquid 27 is water saturated with carbon dioxide. In an alternative embodiment, the conductive liquid 27 is IPA. The conductive liquid 27 such as IPA can be thermally conditioned before it comes into contact with the substrate W. The conductive liquid 27 can be used to thermally condition the substrate W. The conductive liquid 27 is configured to improve the transfer of heat between the substrate support 20 and the substrate W. For example, IPA can improve the heat transfer coefficient between the substrate W and the substrate support 20.

In the embodiments shown in the Figures, the supply channels 28, 31 are provided at an intermediate radius, with extraction channels 29, 30 radially inward and radially outward. However, other configurations are possible. In an embodiment, the supply channels 28, 31 and extraction channels 29, 30 are provided so as to promote radial flow over the lower surface 25 of the substrate W. The flow rate and pressure can be controlled.

In an embodiment the lower surface 25 of the substrate W is coated with a coating. The coating is configured to reduce the surface free energy at the lower surface 25 of the substrate W. In an embodiment the coating is applied after the lower surface 25 of the substrate W has been dried. In an embodiment a bubbler is configured to evaporate the liquid coating material into a gaseous carrier medium. In an alternative embodiment, controlled evaporation mixing can be used to evaporate the liquid coating material into a gaseous carrier medium.

Embodiments have been described above in which the substrate support 20 is comprised in the storage unit. In an alternative embodiment, the substrate support 20 is disposed in another unit or in another position within the lithographic apparatus 100. For example, the substrate support 20 may be comprised in a temperature stabilisation unit configured to stabilise the temperature of the substrate W. The temperature stabilisation unit may be thermally conditioned, for example by flow of a thermal conditioning liquid and/or by gas showers. In an embodiment the substrate support 20 is positioned at a threshold over which the substrate W is translated when the substrate W is moved through the lithographic apparatus 100.

The substrate support 20 may be positioned such that the substrate W is translated to and from it before the substrate W is positioned on the substrate table WT.

In an embodiment the substrate support 20 is outside of the lithographic apparatus 100. For example, the substrate support 20 may be at a position through which the substrate W is translated before the substrate W enters the lithographic apparatus 100, or the substrate support 20 may be provided in a standalone unit (such as a storage unit or a temperature stabilisation unit) separately from the lithographic apparatus 100.

In an embodiment, a device is manufactured by a device manufacturing method comprising using the lithographic apparatus 100 as described above. The lithographic apparatus 100 transfers a pattern from the patterning device MA to the substrate W. In an embodiment, the device manufacturing method comprises the method of manipulating charge distribution and/or the method of drying a substrate W as described above.

Embodiments are provided according to the following clauses:

1. A substrate support configured to support a substrate, the substrate support comprising:
   a plurality of burls protruding from a base surface of the substrate support, the burls having distal ends in a plane for supporting a lower surface of the substrate with a gap between the base surface of the substrate support and the lower surface of the substrate; and
   a liquid supply channel for supplying a conductive liquid to the gap so as to bridge the gap between the base surface of the substrate support and the lower surface of the substrate, thereby allowing charge to pass between the substrate support and the substrate;
   wherein the substrate support has a controlled electrical potential such that charge distribution at the lower surface of the substrate can be manipulated.

2. A substrate support configured to support a substrate, the substrate support comprising:
   a plurality of burls protruding from a base surface of the substrate support, the burls having distal ends in a plane for supporting a lower surface of the substrate with a gap between the base surface of the substrate support and the lower surface of the substrate; and
   a vapour supply channel for supplying a vapour of a conductive liquid to a region of the lower surface of the substrate adjoining the distal end of at least one of the burls, thereby allowing charge to pass between the region of the lower surface of the substrate and the burl;
   wherein the distal end has a controlled electrical potential such that charge distribution at the lower surface of the substrate can be manipulated.

3. The substrate support of clause 1 or clause 2, further comprising a gas supply channel for supplying gas to the gap so as to displace the conductive liquid from the gap and/or wherein the conductive liquid or the vapour of a conductive liquid is supplied such that a moisture layer of the conductive liquid is formed at the lower surface of the substrate.

4. The substrate support of any of clauses 1 to 3, wherein at least part of the substrate support is electrically grounded or electrically biased.

5. The substrate support of any of clauses 1 to 4, comprising:
   one or more extraction channels for extracting at least one of gas and liquid from the gap,
   optionally wherein the base surface is shaped such that the gap narrows towards the one or more extraction channels.

6. The substrate support of any of clauses 1 to 5, wherein:
   the conductive liquid comprises at least one selected from a group consisting of $CO_2$ saturated water and isopropyl alcohol; and/or
   the substrate support is configured to use a mechanical clamping technique to hold the substrate.
7. A lithographic apparatus comprising the substrate support of any of clauses 1 to 6, wherein the substrate support is stationary.
8. A method for manipulating charge distribution of a lower surface of a substrate, the method comprising:
   supporting a lower surface of the substrate on a plurality of burls protruding from a base surface of a substrate support, the burls having distal ends in a plane, with a gap between the base surface of the substrate support and the lower surface of the substrate; and
   supplying a conductive liquid to the gap so as to bridge the gap between the base surface of the substrate support and the lower surface of the substrate, thereby allowing charge to pass between the substrate support and the substrate;
   wherein the substrate support has a controlled electrical potential such that charge distribution at the lower surface of the substrate is manipulated.
9. The method of clause 8, comprising supplying gas to the gap so as to move the conductive liquid in the gap radially, such that charge passes between charged locations of the lower surface of the substrate and the base surface of the substrate support as the conductive liquid moves into contact with the charged locations.
10. The method of clause 8 or clause 9, comprising supplying gas to the gap so as to displace the conductive liquid from the gap, wherein the gas comprises a vapour of an organic liquid soluble in the conductive liquid such that vapour dissolves into a meniscus of the conductive liquid while the meniscus moves across the lower surface of the substrate, so as to promote drying of the lower surface.
11. A method for manipulating charge distribution of a lower surface of a substrate, the method comprising:
   supporting a lower surface of the substrate on a plurality of burls protruding from a base surface of a substrate support, the burls having distal ends in a plane, with a gap between the base surface of the substrate support and the lower surface of the substrate; and
   supplying a vapour of a conductive liquid to a region of the lower surface of the substrate adjoining the distal end of at least one of the burls, thereby allowing charge to pass between the region of the lower surface of the substrate and the burl;
   wherein the distal end has a controlled electrical potential such that charge distribution at the lower surface of the substrate is manipulated.
12. The method of any of clauses 8 to 11, performed while the substrate is being thermally conditioned in preparation of an exposure process.
13. A method for preparing a substrate for being exposed by a patterned radiation beam, the method comprising:
   entering the substrate into a lithographic apparatus;
   supporting the substrate on a substrate support;
   drying a lower surface of the substrate; and
   moving the dried substrate to a substrate table where an upper surface of the substrate opposite to the lower surface is to undergo exposure by the patterned radiation beam.
14. The method of clause 13, wherein the drying is by supplying a gas flow from the substrate support to a gap between the lower surface of the substrate and a base surface of the substrate support.
15. The method of clause 14, wherein the gas flow provides a gas film for supporting the substrate above the substrate support without contact between the substrate and the substrate support.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:
1. A substrate support configured to support a substrate, the substrate support comprising:
   a plurality of burls protruding from a base surface of the substrate support, the burls having distal ends for supporting a lower surface of the substrate with a gap between the base surface of the substrate support and the lower surface of the substrate;
   a liquid supply channel configured to supply a conductive liquid to the gap so as to bridge the gap between the base surface of the substrate support and the lower surface of the substrate, to allow charge to pass between the substrate support and the substrate; and
   a gas supply channel configured to supply gas to the gap so as to displace conductive liquid from the gap and dry the substrate, and/or one or more extraction channels, located at the gap, configured to extract gas and/or liquid from the gap,
   wherein the substrate support is configured to have a controlled electrical potential such that charge distribution at the lower surface of the substrate can be manipulated.

2. A substrate support configured to support a substrate, the substrate support comprising:
   a plurality of burls protruding from a base surface of the substrate support, the burls having distal ends for supporting a lower surface of the substrate with a gap between the base surface of the substrate support and the lower surface of the substrate;
   a vapour supply channel configured to supply a vapour of a conductive liquid to a region of the lower surface of the substrate adjoining the distal end of at least one of the burls, to allow charge to pass between the region of the lower surface of the substrate and the at least one burl; and
   a gas supply channel configured to supply gas to the gap so as to displace conductive liquid from the gap and dry the substrate and/or one or more extraction channels, located at the gap, configured to extract gas and/or liquid from the gap,
   wherein the distal end is configured to have a controlled electrical potential such that charge distribution at the lower surface of the substrate can be manipulated.

3. The substrate support of claim 1, comprising the gas supply channel configured to supply gas to the gap so as to displace the conductive liquid from the gap and dry the substrate.

4. The substrate support of claim 1, wherein at least part of the substrate support is electrically grounded or electrically biased.

5. The substrate support of claim 1, comprising the one or more extraction channels, located at the gap, configured to extract gas and/or liquid from the gap.

6. The substrate support of claim 1, wherein:
   the conductive liquid comprises $CO_2$ saturated water and/or isopropyl alcohol; and/or
   the substrate support is configured to use a mechanical clamping technique to hold the substrate.

7. A lithographic apparatus comprising the substrate support of claim 1, wherein the substrate support is stationary.

8. A method for manipulating charge distribution of a lower surface of a substrate, the method comprising:
   supporting a lower surface of the substrate on a plurality of burls protruding from a base surface of a substrate support with a gap between the base surface of the substrate support and the lower surface of the substrate;
   supplying a conductive liquid to the gap so as to bridge the gap between the base surface of the substrate support and the lower surface of the substrate, to allow charge to pass between the substrate support and the substrate; and
   supplying gas to the gap so as to displace conductive liquid from the gap and dry the substrate, and/or extracting gas and/or liquid from the gap using one or more extraction channels located at the gap,
   wherein the substrate support has a controlled electrical potential such that charge distribution at the lower surface of the substrate is manipulated.

9. The method of claim 8, further comprising supplying gas to the gap so as to move the conductive liquid in the gap, such that charge passes between charged locations of the lower surface of the substrate and the base surface of the substrate support as the conductive liquid moves into contact with the charged locations.

10. The method of claim 8, comprising the supplying gas to the gap so as to displace the conductive liquid from the gap and dry the substrate, wherein the gas comprises a vapour of an organic liquid soluble in the conductive liquid such that vapour dissolves into a meniscus of the conductive liquid while the meniscus moves across the lower surface of the substrate, so as to promote drying of the lower surface.

11. A method for manipulating charge distribution of a lower surface of a substrate, the method comprising:
   supporting a lower surface of the substrate on a plurality of burls protruding from a base surface of a substrate support with a gap between the base surface of the substrate support and the lower surface of the substrate;
   supplying a vapour of a conductive liquid to a region of the lower surface of the substrate adjoining a distal end of at least one of the burls, to allow charge to pass between the region of the lower surface of the substrate and the at least one burl; and
   supplying gas to the gap so as to displace conductive liquid from the gap and dry the substrate, and/or extracting gas and/or liquid from the gap using one or more extraction channels located at the gap,
   wherein the distal end has a controlled electrical potential such that charge distribution at the lower surface of the substrate is manipulated.

12. The method of claim 8, performed while the substrate is being thermally conditioned in preparation of an exposure process.

13. The method of claim 8, wherein the conductive liquid is supplied such that a moisture layer of the conductive liquid is formed at the lower surface of the substrate.

14. The method of claim 11, wherein the vapour of a conductive liquid is supplied such that a moisture layer of the conductive liquid is formed at the lower surface of the substrate.

15. The method of claim 11, performed while the substrate is being thermally conditioned in preparation of an exposure process.

16. The substrate support of claim 2, comprising the gas supply channel configured to supply gas to the gap so as to displace conductive liquid from the gap and dry the substrate.

17. The substrate support of claim 2, wherein at least part of the substrate support is electrically grounded or electrically biased.

18. The substrate support of claim 2, comprising the one or more extraction channels, located at the gap, configured to extract gas and/or liquid from the gap.

19. The substrate support of claim 2, wherein:
   the conductive liquid comprises $CO_2$ saturated water and/or isopropyl alcohol; and/or
   the substrate support is configured to use a mechanical clamping technique to hold the substrate.

20. A lithographic apparatus comprising the substrate support of claim 2, wherein the substrate support is stationary.

* * * * *